United States Patent
Brors et al.

(10) Patent No.: US 6,352,593 B1
(45) Date of Patent: *Mar. 5, 2002

(54) MINI-BATCH PROCESS CHAMBER

(75) Inventors: Daniel L. Brors; Robert C. Cook, both of Livermore, CA (US)

(73) Assignee: Torrex Equipment Corp., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/909,461

(22) Filed: Aug. 11, 1997

(51) Int. Cl.[7] .............................................. C23C 16/48
(52) U.S. Cl. ....................... 118/724; 118/641; 118/725; 118/730
(58) Field of Search ..................... 156/345; 219/121.36; 117/84, 97, 98; 118/715, 725, 728, 641, 724, 730

(56) References Cited

U.S. PATENT DOCUMENTS

| | | | |
|---|---|---|---|
| 4,105,810 A | 8/1978 | Yamazaki et al. | 427/248 |
| 4,178,877 A | * 12/1979 | Kudo | 118/728 |
| 4,693,777 A | 9/1987 | Hazano et al. | 156/345 |
| 4,728,389 A | * 3/1988 | Logar | 117/97 |
| 4,745,088 A | * 5/1988 | Inoue et al. | 117/98 |
| 4,858,557 A | * 8/1989 | Pozzetti et al. | 118/725 |
| 4,870,245 A | * 9/1989 | Price et al. | 219/121.36 |
| 4,951,601 A | 8/1990 | Maydan et al. | 118/719 |
| 4,969,416 A | 11/1990 | Schumaker et al. | 118/725 |
| 5,067,437 A | * 11/1991 | Watanabe et al. | 118/715 |
| 5,198,071 A | * 3/1993 | Scudder et al. | 117/84 |
| 5,203,956 A | 4/1993 | Hansen | 156/643 |
| 5,272,417 A | 12/1993 | Ohmi | 315/111.21 |
| 5,291,030 A | 3/1994 | Brors | 250/573 |
| 5,383,984 A | * 1/1995 | Shimada et al. | 156/345 |
| 5,458,724 A | 10/1995 | Syverson et al. | 156/345 |
| 5,493,987 A | 2/1996 | McDiarmid et al. | 117/102 |
| 5,551,985 A | 9/1996 | Brors et al. | 118/725 |
| 5,626,678 A | 5/1997 | Sahin et al. | 118/723 E |
| 5,663,087 A | 9/1997 | Yokozawa | 437/762 |
| 5,844,195 A | 12/1998 | Fairbain et al. | 219/121.43 |

FOREIGN PATENT DOCUMENTS

| | | |
|---|---|---|
| JP | 61-197638 | 9/1986 |
| JP | 03-011546 | 1/1991 |
| JP | 08-138620 | 5/1996 |

OTHER PUBLICATIONS

Wolf, S. and Tauber, R.N., "Silicon Processing for the VLSI Era, vol. 1—Process Technology" Lattice Press, 1986, pp191–194.

* cited by examiner

*Primary Examiner*—Gregory Mills
*Assistant Examiner*—Rudy Zervigon
(74) *Attorney, Agent, or Firm*—David H. Jaffer; Pillsbury Winthrop LLP

(57) ABSTRACT

A semiconductor wafer or flat panel display process chamber for thermally driven, chemical vapor deposition, and/or plasma enhanced chemical vapor deposition processes includes a chamber for loading/unloading the substrate to be processed, and another chamber for processing. The substrate is heated with multiple zone radiant heaters arranged around the processing chamber to provide uniform heating. Process gases are injected into and exhausted in a cross flow fashion. The chamber may be used for plasma processing. Shield plates prevent deposition of reactant species on chamber walls, and also serve to diffuse heat uniformly the chamber.

20 Claims, 35 Drawing Sheets

MINI-BATCH PROCESS CHAMBER

BACKGROUND OF THE INVENTION

1. Field of the Invention

This invention relates to a process chamber capable of performing a variety of thermally driven processes and plasma enhanced processes, such as those involved in semiconductor wafer, flat panel display and hard disk manufacturing. More particularly, this invention relates to maintaining one or more rotating substrates within a controlled environment while injecting particular gases to produce the desired process results.

2. Brief Description of the Prior Art

There are a large number of processes that are performed at elevated temperatures inside of enclosed chambers (usually quartz furnace tubes) wherein the pressure, temperature and composition of gases are precisely controlled to produce the desired process results. Many of the processes performed in this fashion are similar for both semiconductor wafer and flat panel display manufacture and the fabrication of other devices on a wide variety of other substrates. For convenience, hereinafter the term wafer will be used with the understanding that the following would apply to the manufacture of flat panel displays and other types of substrates or devices wherein thermally driven (such as alloying, diffusion, annealing and glass reflow), CVD (Chemical Vapor Deposition) and/or PECVD (Plasma Enhanced Chemical Vapor Deposition) processes are employed.

For instance, silicon nitride is typically deposited on a wafers by CVD processing in a hot wall CVD reactor, as depicted in FIG. 1 and described by S. Wolf and R. N. Tauber, "Silicon Processing for the VLSI Era, Volume 1—Process Technology", Lattice Press, 1986, pp. 191–194. As shown in FIG. 1, a quartz-walled reactor 1 includes a quartz chamber 10 housing a boat 12 containing a plurality of wafers 14 which are heated by a furnace 16 having multiple zones of resistance heated elements 16a–16c. Boat 12 typically contains between 80–150 of wafers 14. A silicon nitride film is formed via chemical reaction on each of wafers 14 by injecting from tanks 17 gaseous silane or dichlorosilane and either nitrogen or ammonia into chamber 10 via an injection port 18. Other films such as polysilicon, epitaxial silicon, metals, silicides, and glasses may be formed on wafers 14 in a similar fashion by injecting the appropriate reactant gases into the chamber. These reactant gases are removed from chamber 10 by an exhaust port 19. Still other layers may be grown on the heated wafers such as silicon dioxide by injecting oxygen and/or water vapor into the chamber where the oxygen reacts directly with the surface of the silicon wafer to produce the $SiO_2$.

Such a hot wall CVD chamber 10, as illustrated in FIG. 1, is problematic for numerous reasons. First, during CVD processing of wafers 14, the interior surface of the quartz walls of chamber 10 becomes sufficiently hot so as to enable the deposition of the reactant species thereon. As the deposited layer of reactant vapor becomes thicker, pieces thereof may flake off the quartz walls of chamber 10 and contaminate wafers 14. Further, the formation of such a layer may deplete the reactant species such that little or no vapor deposition occurs on the wafers 14. Consequently, the interior surface of the quartz walls of chamber 10 must be periodically cleaned, for example by using a wet etchant, which involves the complete removal of the quartz chamber from the furnace. Although some in the industry suggest alleviating this problem by positioning liners within chamber 10, the liners are equally prone to flaking and must either be cleaned or replaced on a regular basis.

Note that as shown in FIG. 1, the reactant gases are typically injected into a first end of chamber 10 (via injection port 18) and removed from another end of chamber 10 (via exhaust port 19). As a result, the reactant gases are depleted as they travel through chamber 10 such that the deposition rate of the reactant vapor on those of wafers 14 proximate to injection port 18 is higher than those of wafers 14 proximate to exhaust port 19. This phenomenon is known in the industry as the "gas depletion effect" and may result in unacceptable variations between films formed on the plurality of wafers 14.

Another problem associated with hot wall CVD reactors such as reactor 1 is the significant time required both before and after processing of wafers 14. Pre-processing time includes the time required to load the plurality of wafers 14 into boat 12, insert boat 12 into chamber 10, and slowly ramp up the temperature within chamber 10 from a loading/unloading temperature to a constant and uniform process temperature. Post-processing time includes the time required to slowly ramp the temperature down from the process temperature to the loading/unloading temperature, to remove boat 12 from chamber 10, and to further cool boat 12 and wafers 14 therein to allow wafers 14 to be loaded into plastic wafer cassettes (not shown). The slow insertion rate of boat 12 into chamber 10 and removal rate of boat 12 from chamber 10, as well as the slow temperature ramp up before processing and slow temperature ramp down after processing, are necessary to ensure minimal temperature gradients across the surface of wafers 14, thereby avoiding wafer warping and/or crystal slippage of wafers 14. While actual processing of wafers 14 may require only one-half hour, the time required for the pre- and post-processing procedures just discussed is typically 1 to 2½ hours. Accordingly, this pre- and post-processing time significantly limits the throughput of chamber 10. Further, the slow temperature ramp up, the slow process of obtaining a uniform and constant temperature across the surface of wafers 14, and the slow temperature ramp down result in chamber 10 contributing a relatively high thermal budget (the time that the wafers are above room temperature) to wafers 14. As the size of semiconductor devices continues to decrease, it becomes increasingly important to minimize the thermal budget.

Although employing boat 12 capable of holding a large number of wafers helps to maximize throughput of chamber 10, the simultaneous processing of so many of wafers 14 increases risk of wafer loss should something go wrong during processing. For instance, if a gas flow controller malfunctions or the vacuum pump ceases operating properly, all of wafers 14 in boat 12 may be destroyed.

Further note that where compatible process steps are to be performed on a wafer sequentially, it is often desirable to implement automated sequential processing in order to increase throughput. However, the relatively large size of chamber 10 and the large number of wafers 14 contained in boat 12, coupled with the necessarily slow loading and unloading rate of boat 12 at atmospheric pressure, makes automated sequential processing in chamber 10 very cumbersome, if not impractical.

SUMMARY OF THE INVENTION

An improved reaction chamber is disclosed which overcomes problems in the prior art described above. In accordance with the present invention, the reactor includes a vacuum chamber having two distinct sections. The lower section is used for the loading and unloading of the wafers and the upper section is where the temperature, pressure and the flow of gases can be precisely controlled to produce desired uniform and consistent process results. The reactor is connected to a central transfer vacuum chamber via a slit valve such that the wafers can be loaded into the wafer boat while under vacuum via the robotic arm of the transfer chamber. The wafer boat is supported by a shaft which, being movable in a vertical direction, allows wafers to be loaded/unloaded into the various slots of the wafer boat. Once all the wafers are loaded into the boat, the slit valve is closed and the boat containing the wafers is elevated into the upper section of the chamber. The wafer boat and wafers therein are heated by multiple zone radiant heaters e.g. tungsten halogen lamps arranged around the periphery of the upper section of the chamber and by additional heaters positioned about the top and bottom surfaces of the chamber. In this manner, a desired thermal profile may be obtained. Thermocouples inserted into a high temperature material such as graphite or silicon carbide are positioned at strategic positions within the chamber and provide temperature feedback to the controller (or computer) which, in turn, controls the various heater zones. In other embodiments, pyrometry or other means may provide this temperature feedback.

Once inserted into the upper section of the chamber, the boat and wafers therein are rotated (typically 3 to 30 rpm). After the desired wafer temperature has stabilized, the process gases are injected into and exhausted from the chamber in a cross flow fashion parallel or nearly parallel to the wafers so as to result in a uniform process results. The flow rate of the process gases may be adjusted as function of vertical position relative to the wafer boat via independently controlled gas injection and exhaust ports. In this manner, the ability to optimize the process gas flow pattern within the chamber is realized, irrespective of the particular process gas or gases employed and irrespective of the process pressure.

A plurality of electrically conductive shield plates surround the interior walls of the chamber. Where it is desired to perform PECVD processes and in situ plasma cleaning, RF (radio frequency) power may be applied to a first number of the plates while a second number of the plates are held at ground potential. Further, the shield plates prevent the deposition of the reactant species onto the quartz windows of the chamber and also serve to diffuse heat emitted from the heating elements.

The reaction chamber described below could easily be a stand alone product (without the bottom portion), where the entire boat load of wafers or flat panel displays is inserted into and removed from the reactor instead of single wafer load/unload as described below. Thus, the reaction chamber could be a "manual boat load/unload" reactor (or simple mechanical load/unload) instead of the robotic load/unload system described below. Moreover, the entire machine could be flipped over such that wafer load/unload is accomplished in the upper portion and process in the lower portion. The preferred embodiment is described for bottom load/unload to keep the wafer transport plane (robotic arm height) closer to the floor which is more consistent with other semiconductor process equipment such as single wafer cluster tools.

The gas injection and exhaust systems of this invention are important features. For instance, in many types of CVD furnace reactors, a quartz tube with small holes up and down its length is inserted into the main quartz tube adjacent to the wafers and the process gases are introduced via the holes in this smaller tube in an effort to overcome gas depletion effects to achieve better uniformity and higher deposition rates throughout the boat load of wafers. However, since the smaller tube is in an isothermal environment with the wafers and is at the same deposition temperature, the CVD material being deposited on the wafers is also being deposited on the edges of these holes and in a relatively short period of time, this deposit will start clogging the holes and can flake off and fall onto the wafers. Further, as one tries tc increase the flow of the reactant gases in these smaller tubes in order to achieve even higher deposition rates on the wafers, the partial pressure within the tube increases which in turn accelerates the deposition on the tube's walls and at the holes. Because the present invention utilizes a cooled gas injection scheme and because the gas injection rate can be tuned up and down the wafer load, the deposition rates achievable in the reactor of this invention can be from 5 to 30 times greater than that for a typical furnace type reactor, while still maintaining desired uniformity from wafer to wafer and across each wafer. The tuning of the exhaust further enhances the ability to achieve maximum deposition rates while maintaining deposition uniformity on the wafers. Further, the present invention provides for the heating of the exhaust plate and manifold which is desirable for many CVD processes to prevent condensation which can also lead to the generation of particles that can migrate to the wafers. Finally, since the injection and exhaust plates are merely bolted onto the chamber, they can be easily removed and replaced if necessary.

The plasma capability of the present invention is of significance. In addition, the way the RF energy is coupled to opposing sets of side shield plates in conjunction with the presence of the upper and lower shield plates makes for a nearly symmetrical geometry which is important to maximize the plasma's energy uniformity. This design also allows for switching the RF from side to side which aids in the uniformity of material removal during in situ plasma cleaning. The RF input assembly is designed with dark space shielding to eliminate the creation of a plasma behind the shield plate clips which otherwise would cause hot spots in that area that would detract from the energy and uniformity of the plasma in the cleaning region of the chamber.

The cold wall construction of the present invention: a) allows for use of multiple zone radiant heating with simple and inexpensive quartz windows (the total cost of the quartz parts of the present invention is one-tenth or less the cost of replacing the quartzware of a conventional vertical furnace); b) allows for cluster tool configuration for automatic load/unload under vacuum and for sequential processing from one reactor (process A) to another (process B) and so on; c) reduces deposition on the cooled walls; d) eases attachment/removal of sub-assemblies such as the side heaters, gas injection, exhaust manifold and RF/TC seal plates; and e) permits accelerated temperature ramp down when the pressure within the chamber is increased with inert gas flow to permit greater heat conduction through the gas to the cold walls.

The multi-zone radiant heating of the present invention provides: a) much lower thermal inertia compared to a resistively heated furnace, resulting in faster response time; b);as many as ten to twelve independent heat zones (compared to 5 to 7 for a typical vertical furnace); and c) the ability to tailor the thermal pattern within the chamber for faster temperature ramping without wafer warpage or crystal slippage.

The wafer rotation feature of the present invention promotes better uniformity across a wafer and from wafer-to-wafer, while permitting faster deposition rates (up to 5 to 30 times faster deposition rates than a conventional furnace).

The low thermal mass-shielded plates of the present invention have the following advantages: a) the bottom, top and side shield plates entirely surround the wafers and serve to diffuse the heat energy from the lamps for greater uniformity; b) the low thermal mass permits rapid cycling of temperature; c) the existence of these plates allows for inert gas to be injected between the plate and the quartz window to prevent the reactive process gases from penetrating and causing deposition on the window; and d) the shield plates are made of materials (graphite, silicon carbide, ceramic, etc.) that result in a very high level of adhesion of typical CVD films even during temperature cycling compared to a quartz furnace type reactor where particles of the deposited material on the quartz can easily flake off and onto wafers.

The bottom shield plate of the present invention: a) moves up and down with the wafer boat; b) can be left floating or grounded or connected to the RF energy source during plasma processing; c) provides a degree of thermal isolation between the upper process chamber and the lower load/unload chamber; d) with inert gas flow into the lower chamber, the plate serves to effectively retard the process gases from entering the lower chamber; e) the existence of the plate greatly enhances the ability to achieve a uniform gas flow pattern in the process chamber by serving as a bottom plate to the process chamber such that the top plate and the bottom shield are approximately equidistant with respect to the boat of wafers, and f) diffuses the heat from the bottom heaters.

IN THE DRAWING

FIG. 31b is a front view of the gas injection system of FIG. 31a;

FIG. 32b is a front view of the gas injection system of FIG. 32a;

DESCRIPTION OF THE PREFERRED EMBODIMENTS

Figure 1:
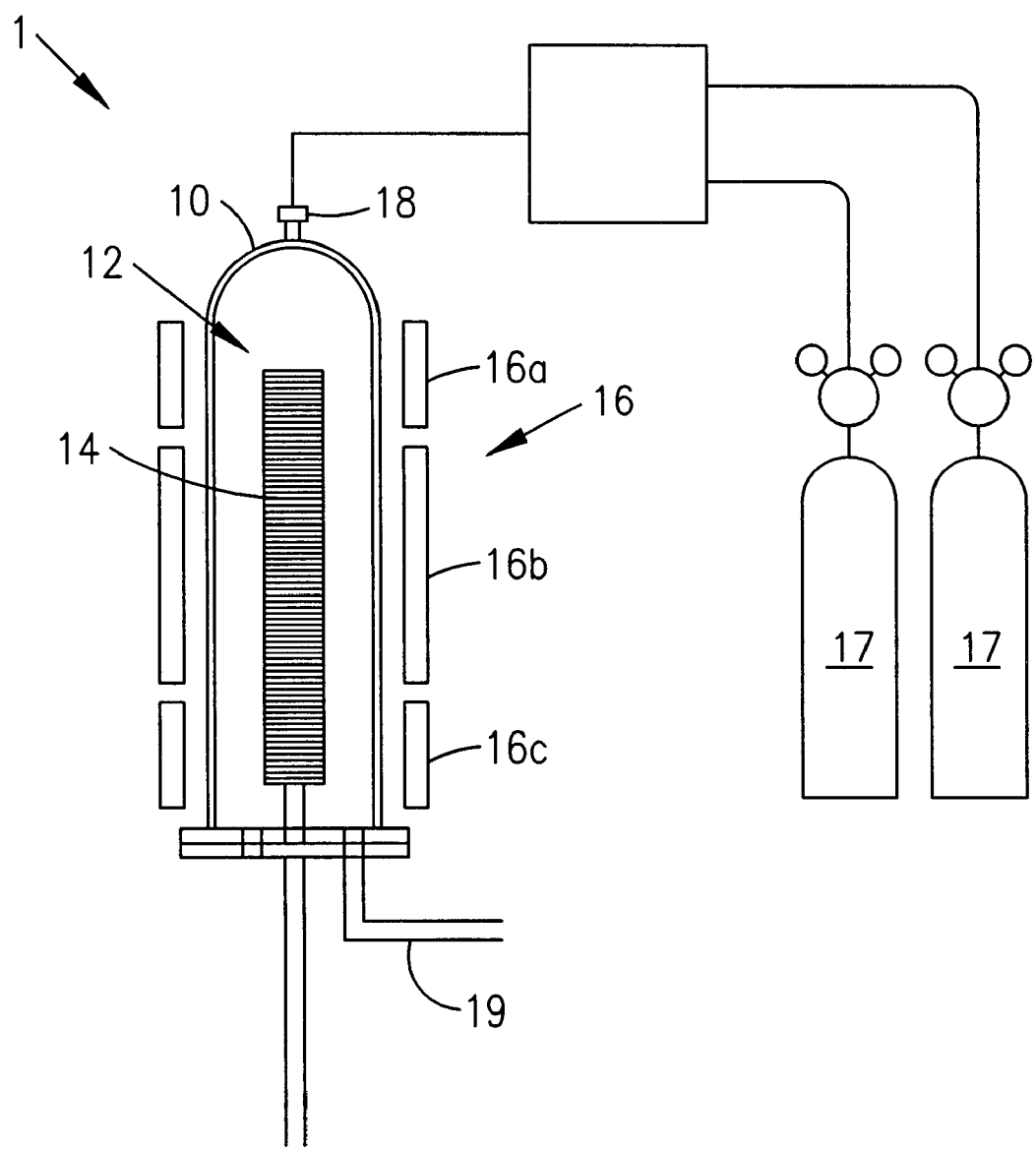
FIG. 1 is a cross-sectional view of a conventional hot wall CVD reactor 1.

Embodiments of the present invention are discussed below with reference to the drawing figures, where like elements are similarly labelled. Note that the present invention is described below in the context of the CVD deposition of a silicon nitride film on a semiconductor wafer by way of example only. Indeed, the teachings herein are equally applicable for the deposition or growth of other materials, for example polycrystalline silicon upon other appropriate surfaces such as flat panel displays, and to other processes performed at pressure both greater than and less than atmospheric pressure, including but not limited to thermally driven and PECVD (plasma enhanced CVD) processes. The teachings herein also apply to other processes requiring uniform temperatures, certain pressures and gas mixtures such as the growth of silicon dioxide, annealing, glass reflow, diffusion, etc,.

Figure 2:
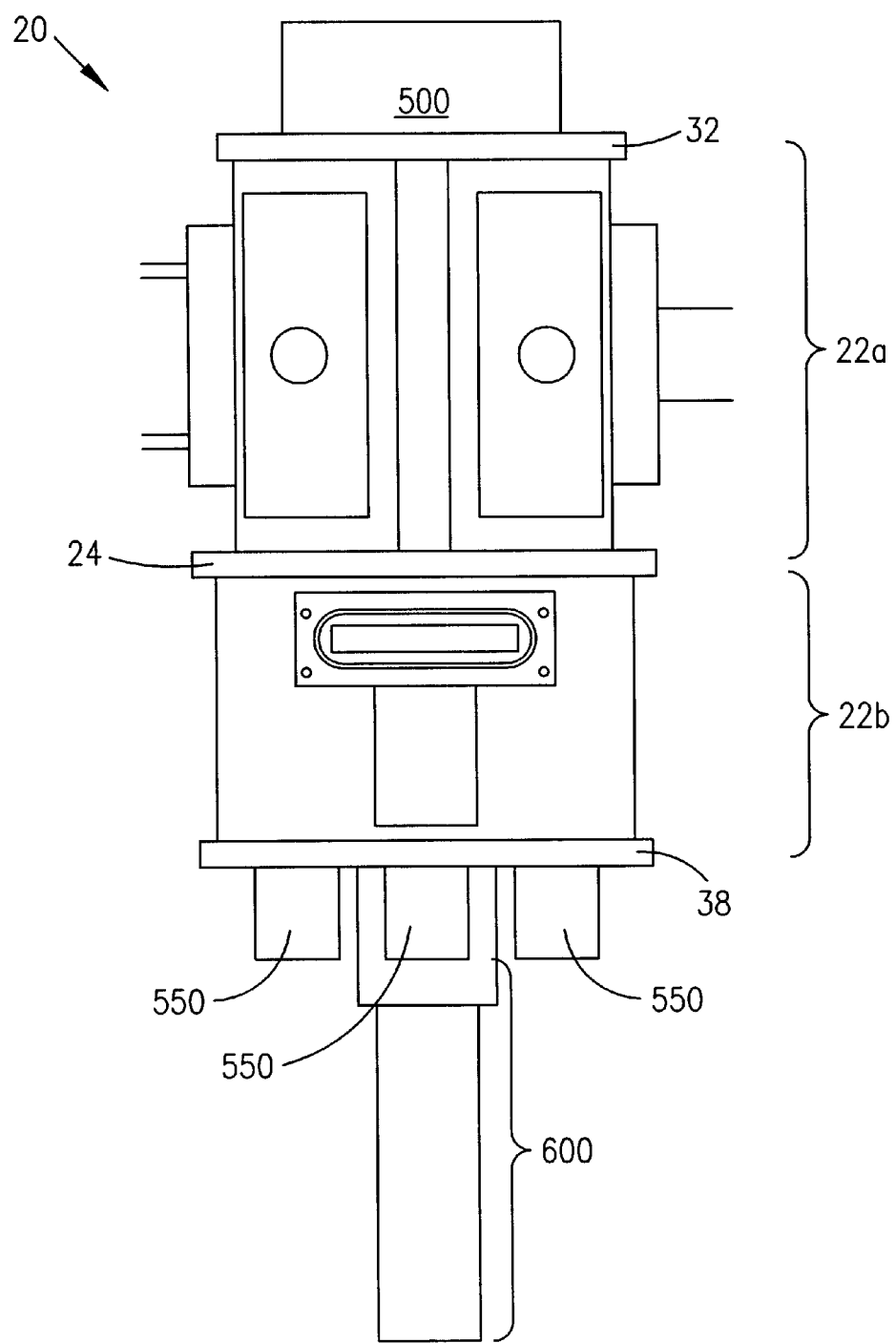
FIG. 2 is a side view of a CVD reactor in accordance with the present invention.

Referring first to FIG. 2, a CVD reactor 20 includes a vacuum chamber 22 having an upper portion 22a and a lower portion 22b where, as explained in more detail below, lower portion 22b is used for inserting wafers into and removing wafers from reactor 20 and upper portion 22*a* is used as the processing chamber. Upper portion 22*a* and lower portion 22*b* are welded together or bolted together and vacuum sealed using an O-ring structure 24 or other conventional means.

Figure 3:
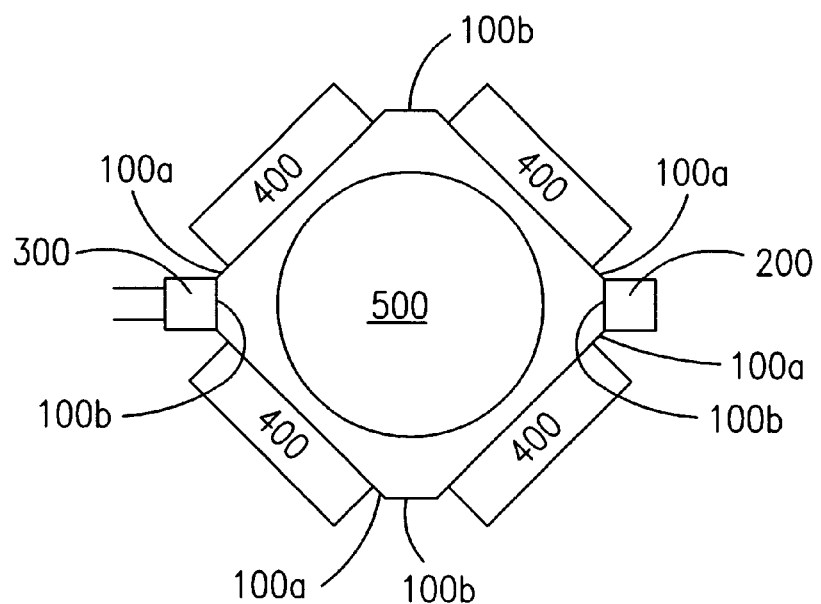
FIGS. 3 and 4 are respective top and bottom views of the reactor of FIG. 2.

Referring also to FIG. 3, upper portion 22*a* has four walls 100*a* and four walls 100*b* all of which may be cooled via recirculating water or other liquid. A gas injection manifold 200 and a gas exhaust manifold 300 attached to opposite walls 100*b* are discussed in more detail below. A multiple zone heating structure 400 is attached to each of the four side walls 100*a*. A liquid-cooled top plate 32 made of for instance aluminum is vacuum sealed via an O-ring or other means (not shown) to side walls 100*a* and 100*b*. A multiple zone heating structure 500 is positioned above top plate 32.

Figure 4:
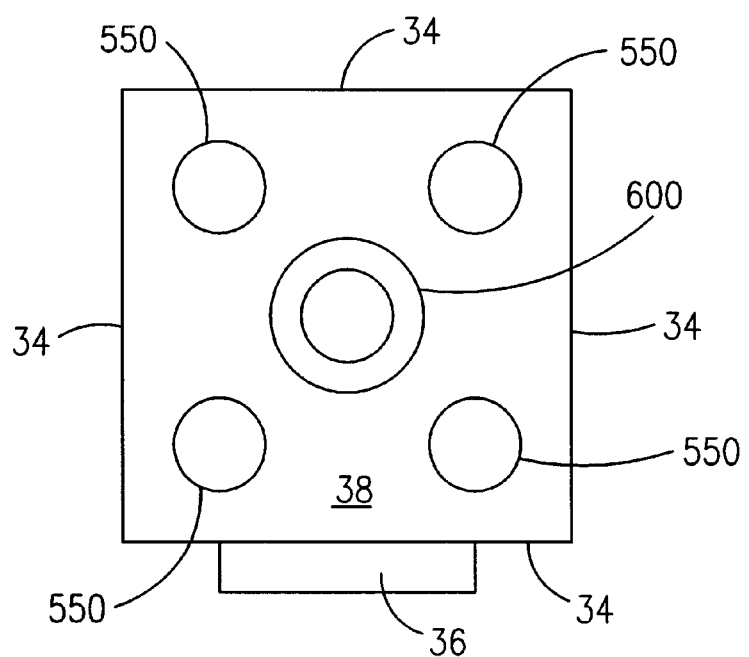

Referring now to FIGS. 2 and 4, lower portion 22*b* includes four side walls 34. Attached to one of these side walls is a slit valve 36 through which a mechanical or robotic arm may insert (remove) a wafer into (from) lower portion 22*b* in a well known manner. Slit valve 36 is vacuum sealed to its associated one of side walls 34 in a well known manner using for instance an O-ring (not shown). A bottom plate 38 made of for instance aluminum is attached to and vacuum sealed to each of side walls 34 using an O-ring (not shown). A plurality of heating structures 550 similar to heating structure 500 are attached to an exterior surface of bottom plate 38. A lift and rotation mechanism 600 which is discussed in more detail below is positioned in the middle of bottom plate 38.

Figure 5:
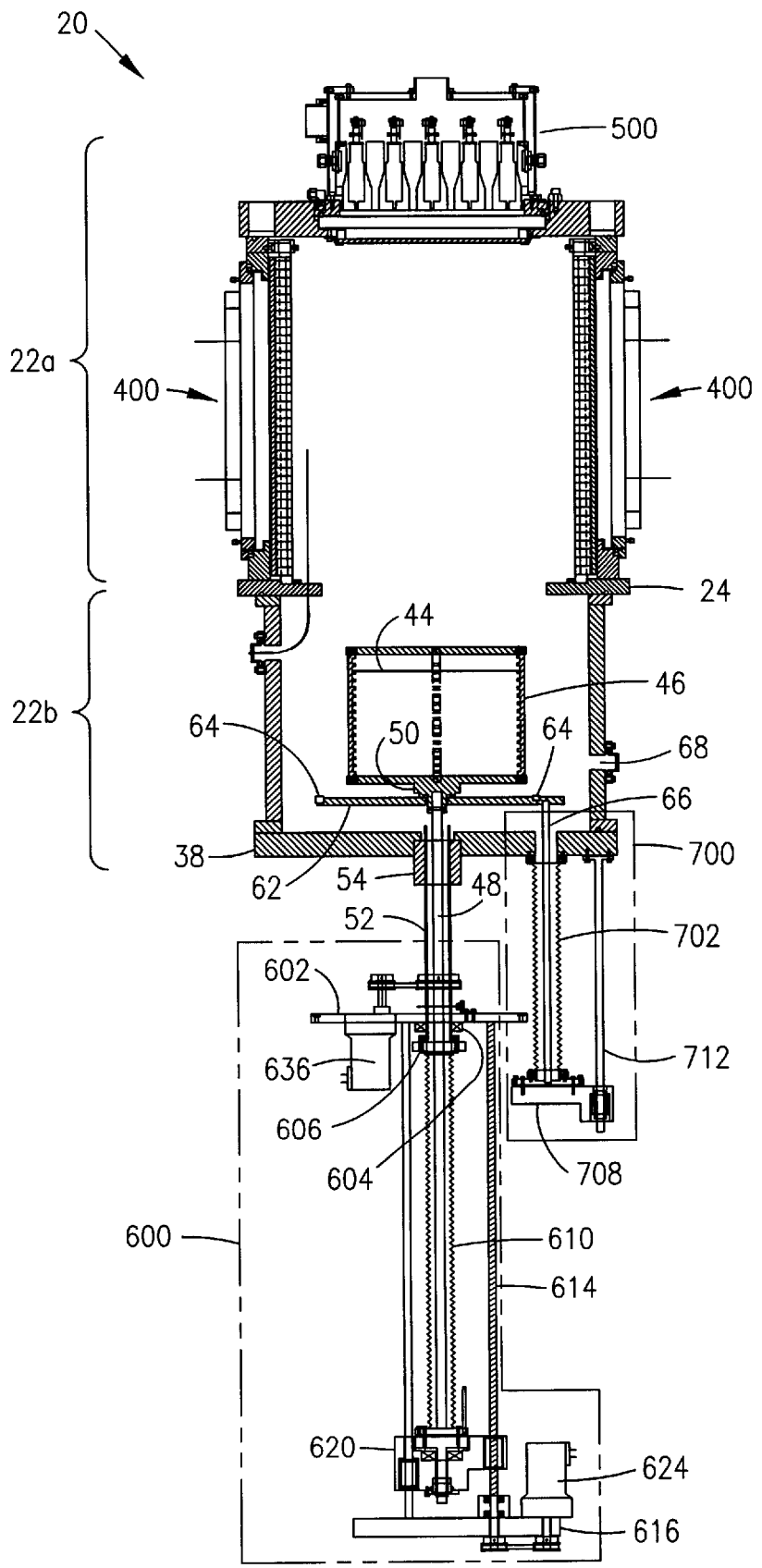
FIG. 5 is a cross-sectional view of the reactor of FIG. 2 with the wafer boat in a loading/unloading position (bottom heaters not shown)

Referring now to FIG. 5, which shows reactor 20 in a loading/unloading condition, a wafer 44 is loaded into one of the plurality of slots of a wafer boat 46 by a mechanical or robotic arm through slit valve 36 (not shown in FIG. 5). Boat 46 may be constructed of any suitable high temperature material such as, for instance, quartz, silicon carbide, or graphite, depending upon desired process characteristics. Note that although shown in FIG. 5 as holding up to fifteen of wafers 44, boat 46 may in other embodiments hold a greater or fewer number of wafers 44.

Boat 46 is mounted to a first end of an inner shaft 48 via a fitting 50 integrally attached to a bottom surface of boat 46. Shaft 48 passes through associated openings in the middle of bottom plate 38 and between the heating structures 550 (not shown for simplicity in FIGS. 5 and 6) and into a hollow outer shaft 52 having a first end protruding upwards towards the hole of bottom plate 38. A ferrofluidic or other suitable seal 54 vacuum seals outer shaft 52 to chamber 22. Referring also to FIG. 7, which shows a portion 600*a* of a lift and rotate mechanism 600, outer shaft 52 passes through an associated opening in an upper mount plate 602 and is secured thereto by a clamp and bearing assembly 604. Outer shaft 52 is vacuum sealed to an upper bellows disk 606 via an O-ring 608. An opening in the center of upper bellows disk 606 allows shaft 48 to pass into a hollow bellows 610 positioned between and welded to each of upper bellows disk 606 and a lower bellows disk 612. A second end of shaft 48 is securely attached to lower bellows disk 612.

Figure 8:
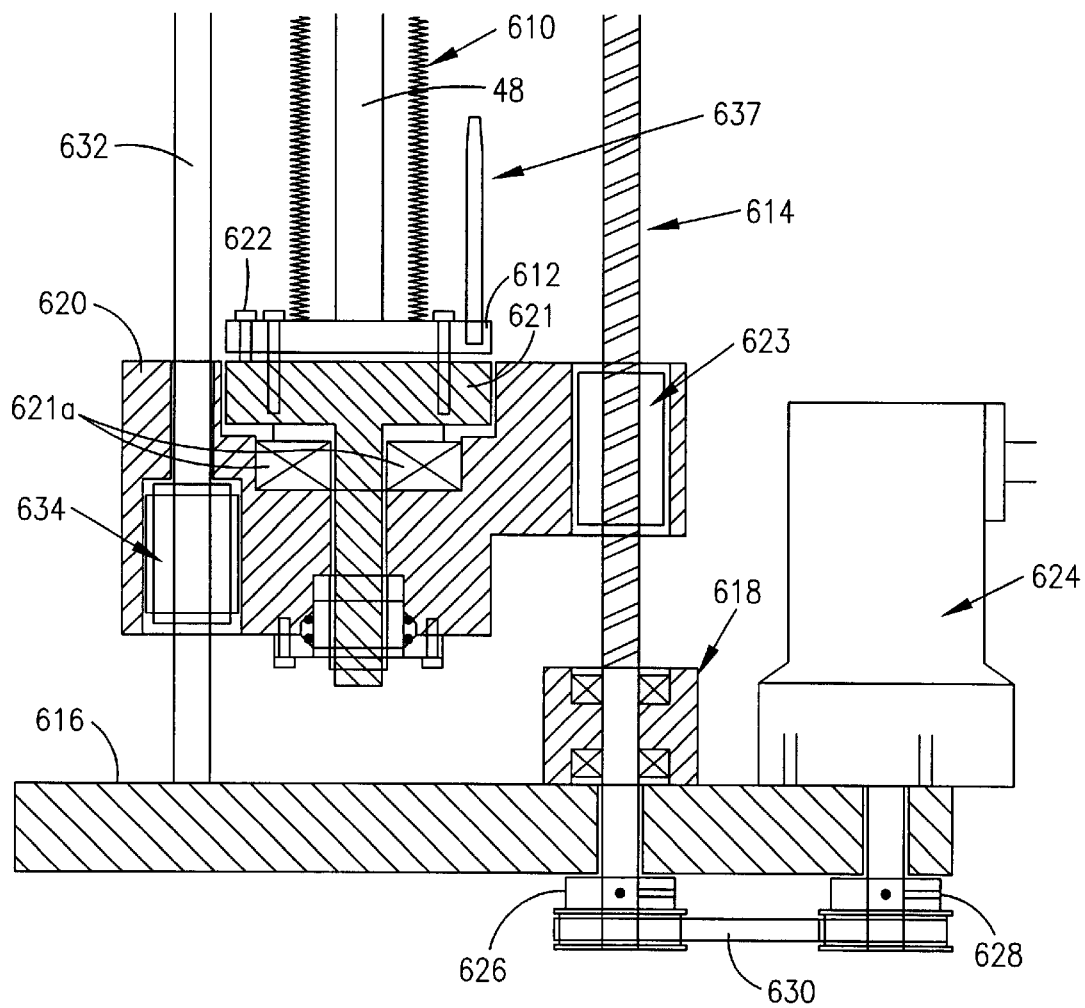
FIG. 8 is an exploded cross-sectional view of the reactor of FIG. 2 illustrating a first lifting mechanism in accordance with the present invention.

Referring also to FIG. 8, a lead screw 614 is positioned between upper mount plate 602 and a lower mount plate 616. Lead screw 614 is affixed to upper mount plate 602 by a bearing clamp assembly (not shown) and is secured to lower mount plate 616 by a bearing assembly 618 which allows lead screw 614 to freely rotate. Lower bellows disk 612 is mounted onto a lift carriage 620 via a rotation disk 621. Three threaded holes in lower bellows disk 612 allow leveling screws 622 (only one is shown for simplicity) to adjust the angle of shaft 48. If necessary, rotation disk 621 is held in place by bearing assemblies 621*a* within lift carriage 620. A lead nut 623 provided within lift carriage 620 engages lead screw 614. The shaft of lead screw 614 passes through an associated opening in lower mount plate 616. An electric motor 624 mounted to lower mount plate 616 rotates lead screw 614 via a pulley 626 attached to the shaft of lead screw 614, a pulley 628 attached to motor 624, and a belt 630 which engages pulleys 626 and 628. One or more guide rails 632 passing through one or more associated linear bearings 634 provided within lift carriage 620 are positioned between upper mount plate 602 and lower mount plate 616 to ensure smooth vertical motion of wafer boat 46.

A motor 636 mounted underneath upper mount plate 602 rotates outer shaft 52 and wafers 44 via a pulley 638 coupled to motor 636, a pulley 640 mounted about outer shaft 52, and a belt 642 engaging pulleys 638 and 640 (FIG. 7). A slotted disk and photocell assembly 644 mounted on upper mount plate 602 stops the rotation of outer shaft 52 and wafers 44 at a predetermined "home" position to facilitate the loading and unloading of wafers 44 through slit valve 36. Alternatively a commercial shaft encoder could be used for the same purpose of stopping at the predetermined "home" position.

Figure 6:
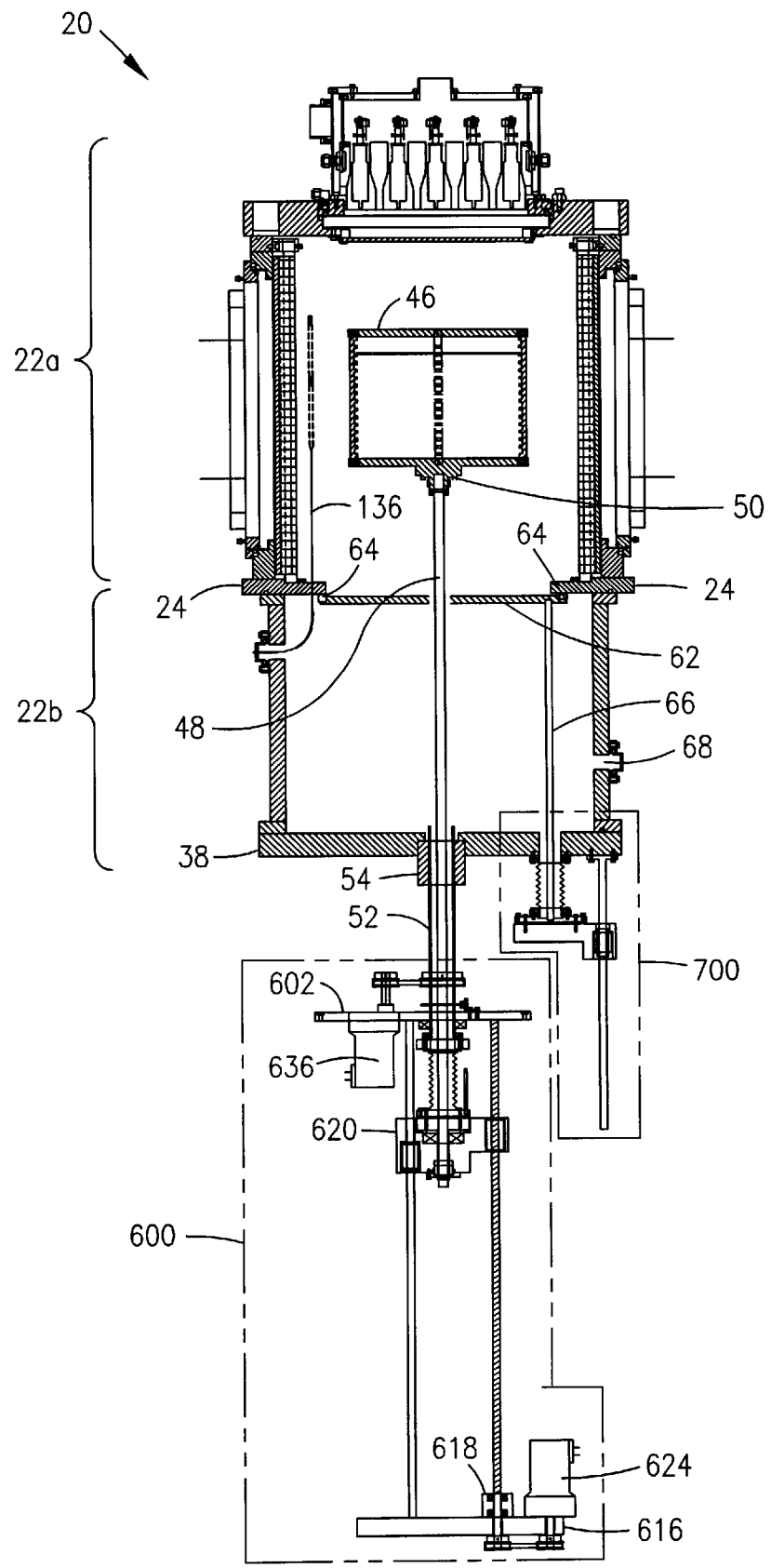
FIG. 6 is a cross-sectional view of the reactor of FIG. 2 with the wafer boat in a processing position (bottom heaters not shown)
Figure 7:
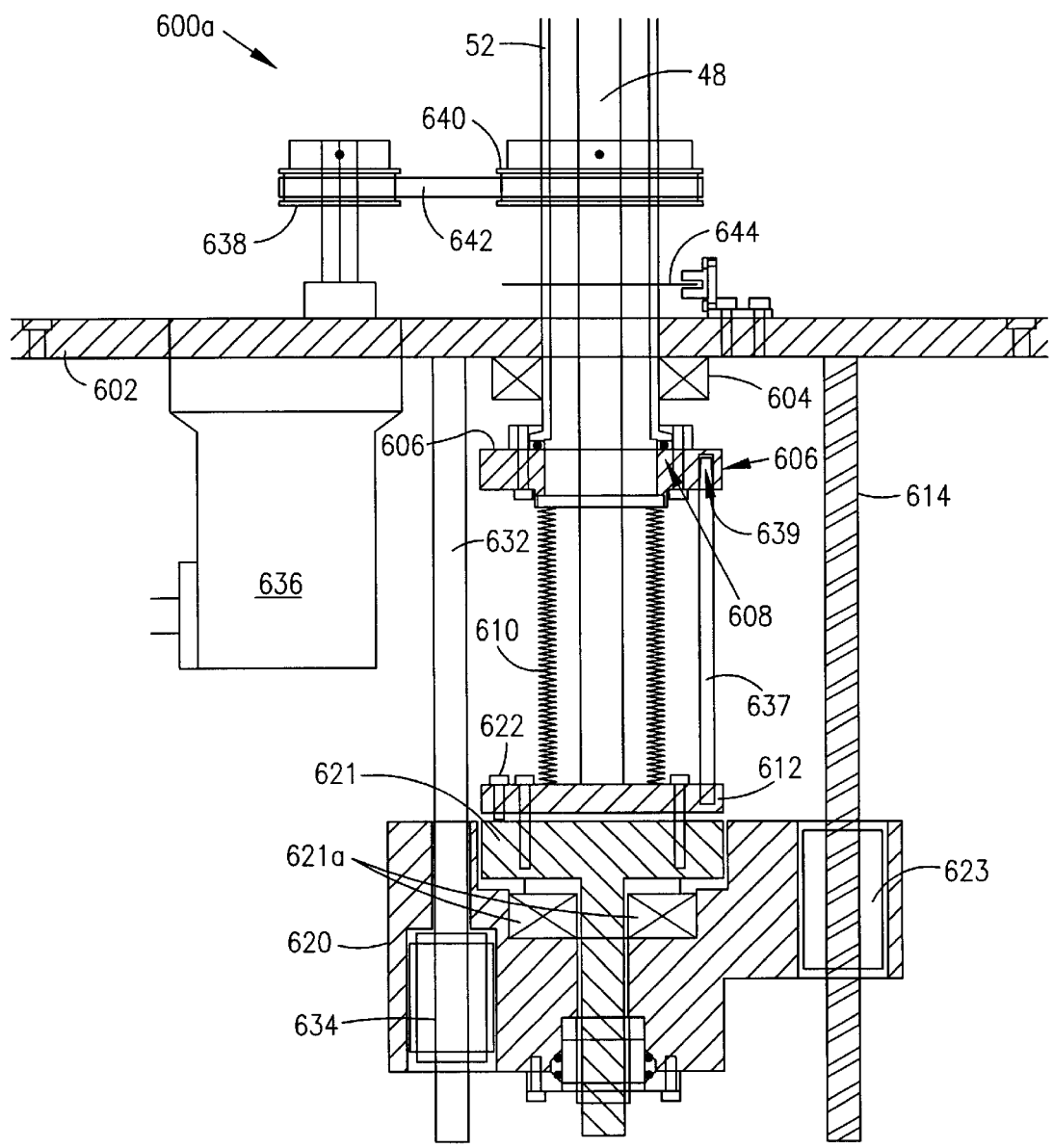
FIG. 7 is an exploded cross-sectional view of the reactor of FIG. 2 illustrating a rotating mechanism in accordance with the present invention.
Figure 10:
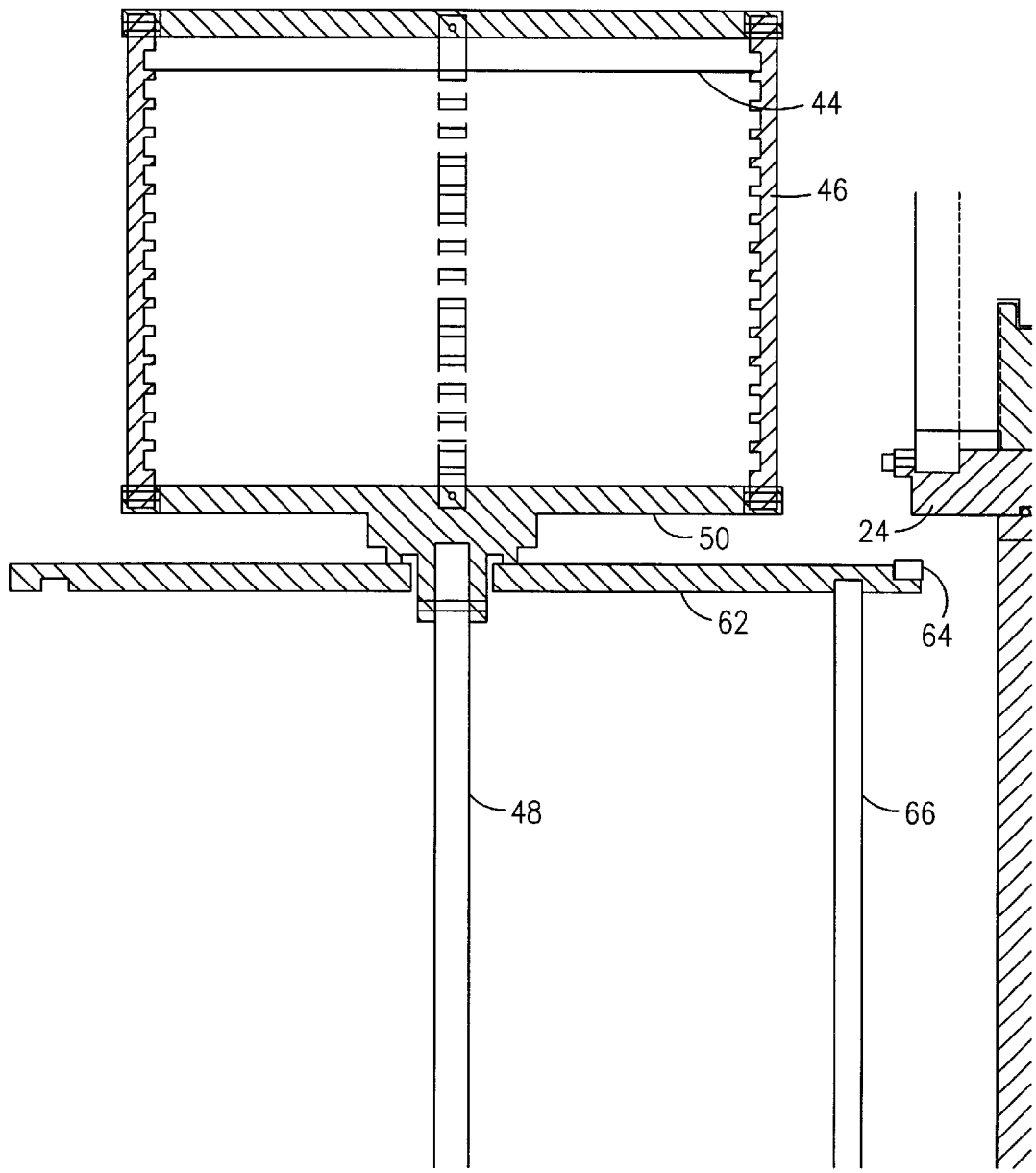
FIG. 10 is a cross-sectional view of the wafer boat in accordance with the present invention.
Figure 11:
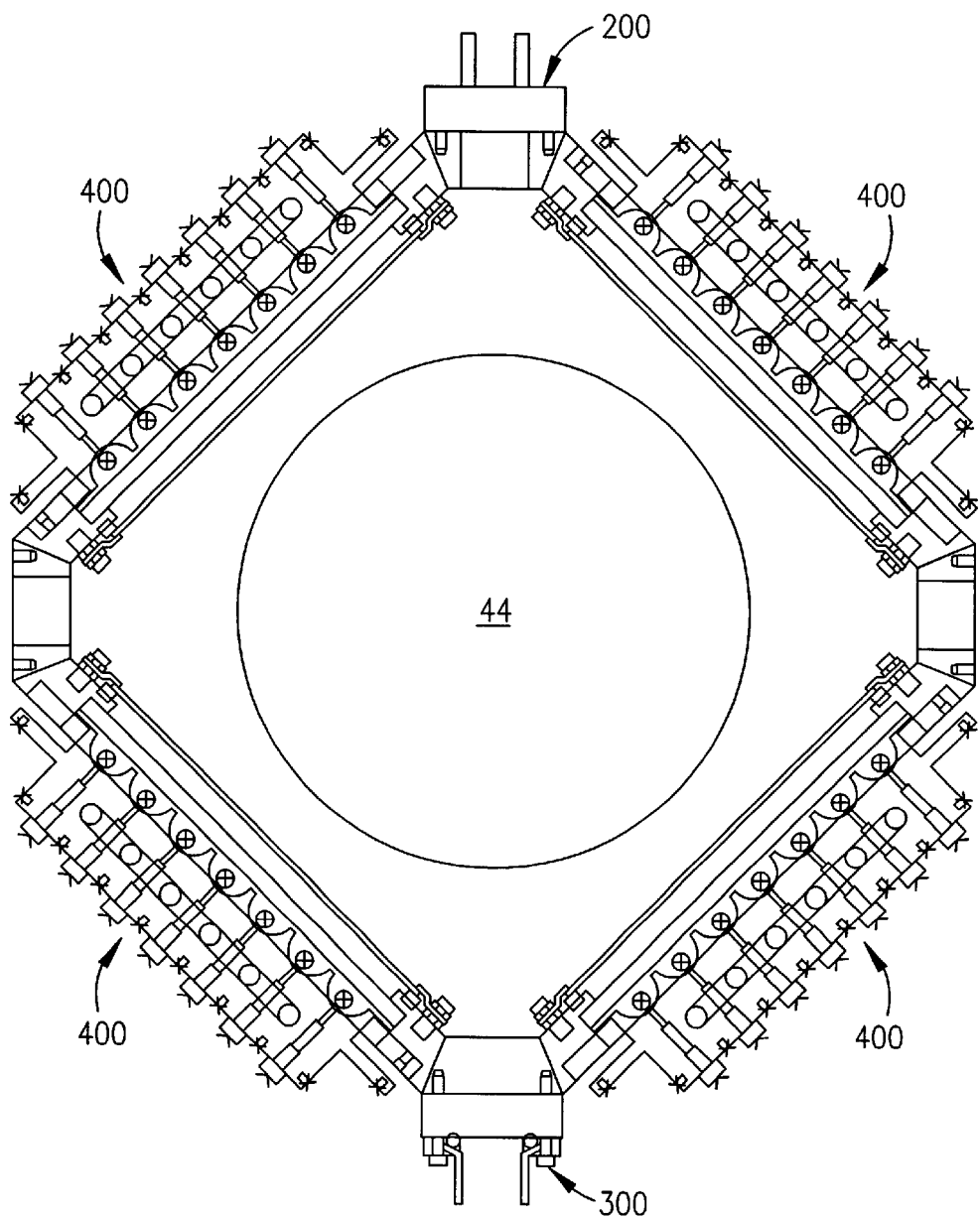
FIG. 11 is a top cross-sectional view of the reactor of FIG. 2.

A circular seal plate 62 having an opening formed therein through which shaft 48 passes is positioned immediately below boat 46 (FIGS. 6 and 10). Seal plate 62 is constructed from a suitable high temperature material such as for instance graphite or silicon carbide and has nested into a groove around the outer periphery of its top surface a quartz ring 64. Seal plate 62 is supported by three lift rods 66 constructed from a suitable high temperature material (only one lift rod 66 is shown for simplicity). Lift rods 66 are each operatively coupled to a lift mechanism 700 (only one is shown for clarity).

Figure 9:
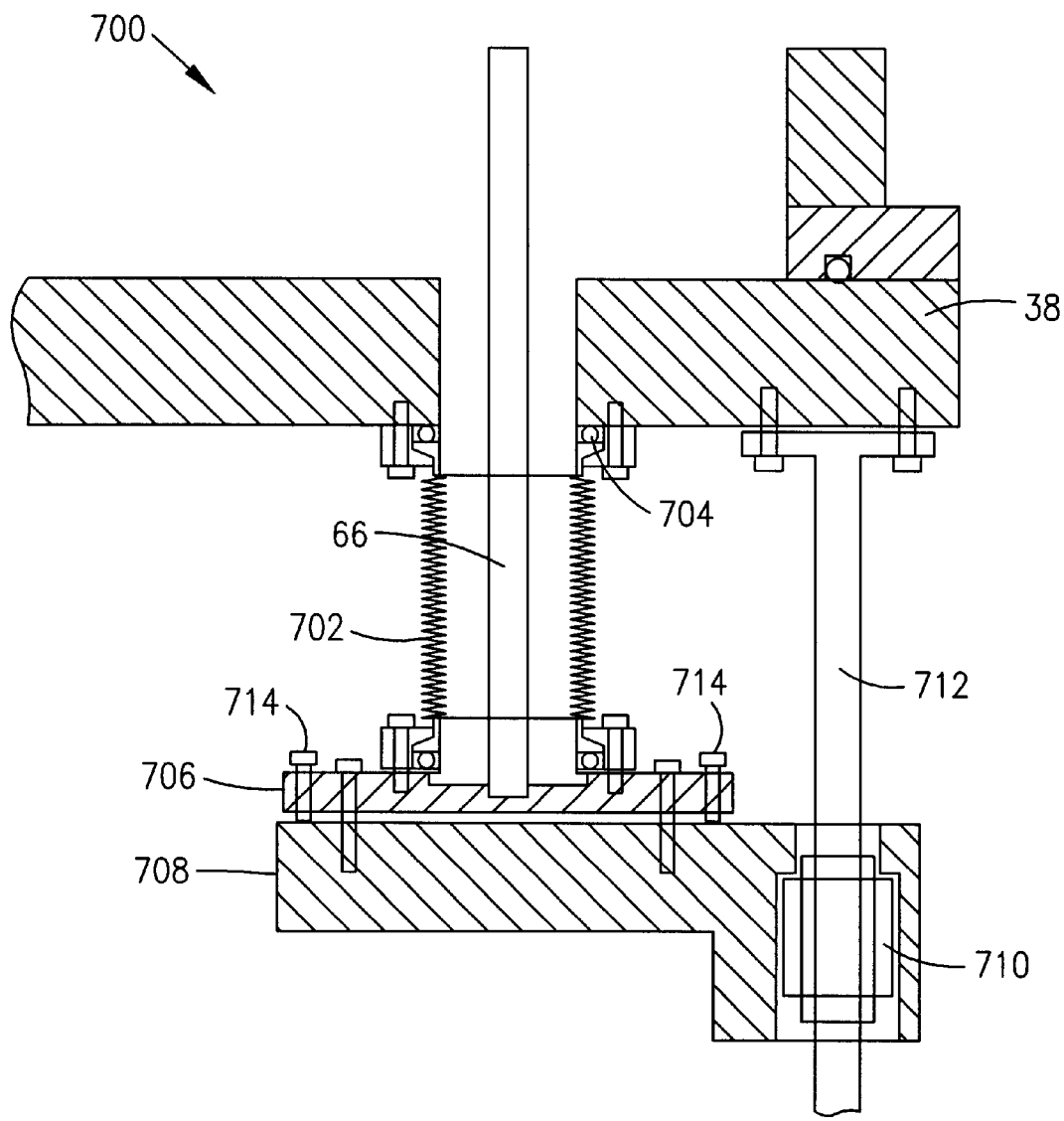
FIG. 9 is a cross-sectional view of the reactor of FIG. 2 illustrating a second lifting mechanism in accordance with the present invention.

Referring now to FIGS. 5, 6 and 9, lift mechanism 700 includes a bellows 702 within which an associated one of lift rods 66 is positioned. Bellows 702 has a first end mounted to bottom plate 38 and vacuum sealed thereto by an O-ring 704 and has a second end mounted to a leveling disk 706 which, in turn, is mounted on a lift carriage 708. Lift carriage 708 includes a linear bearing 710 which engages a guide rail 712, thereby ensuring smooth linear motion of lift carriage 708. Three leveling screws 714 are provided within leveling disk 706 to maintain lift rods 66 in a proper position. In order to minimize heat transfer from chamber 22 to lift mechanism 700, lifting rods 66 may be constructed using two separate rods connected together in an end-to-end fashion, where the upper one of the separate rods is quartz and the lower one of the separate rods being a high temperature material such as for instance titanium or molybdenum. In the case where chamber 22 is maintained at a pressure less than atmospheric, the force acting upon the bellows 702 will be such that the bellows 702 will tend to collapse in length causing the lift rods 66 and the seal plate 62 to move upwards. Since the hole in the seal plate 62 is smaller than the diameter of the fitting 50, the seal plate 62 and lift rods 66 can only move upwards as the boat 46 moves upwards. The seal plate 62 will stop its upward motion when the top surface of quartz ring 64 comes in contact with the O-ring structure 24 of the upper portion 22*a* of chamber 22. Conversely, as the boat 46 moves downward from the upper portion 22*a* to the lower portion 22*b*, the fitting 50 comes in contact with the seal plate 62 and thereafter the seal plate 62 will continue to move downward along with the downward motion of the boat 46. In the case where the pressure in chamber 22 is so low as to produce excessive upward force on bellows 702, lift rods 66 and seal plate 62, a simple constant force spring mechanism pulling in the opposite or downward direction can be attached to the lift carriage 708 so that the net upward force will be maintained at lower more moderate level. Alternatively, the seal plate 62 could be raised and lowered by means of hydraulic or pneumatic actuator(s) attached to lift mechanisms 700 or an electric motor or motors could be attached to the lift mechanisms 700 for the same purpose.

After each of wafers 44 is loaded into an associated slot of boat 46, the mechanical arm (not shown) is retracted and boat 46 is elevated a predetermined distance so as to allow the mechanical arm to load the next one of wafers 44 into the next slot of boat 46. This process is repeated until the desired number of wafers 44 are loaded into boat 46. After slit valve 36 is closed, boat 46 and wafers 44 therein are then elevated from lower chamber portion 22b to a processing position within upper chamber portion 22a, as shown in FIG. 6.

Figure 18:
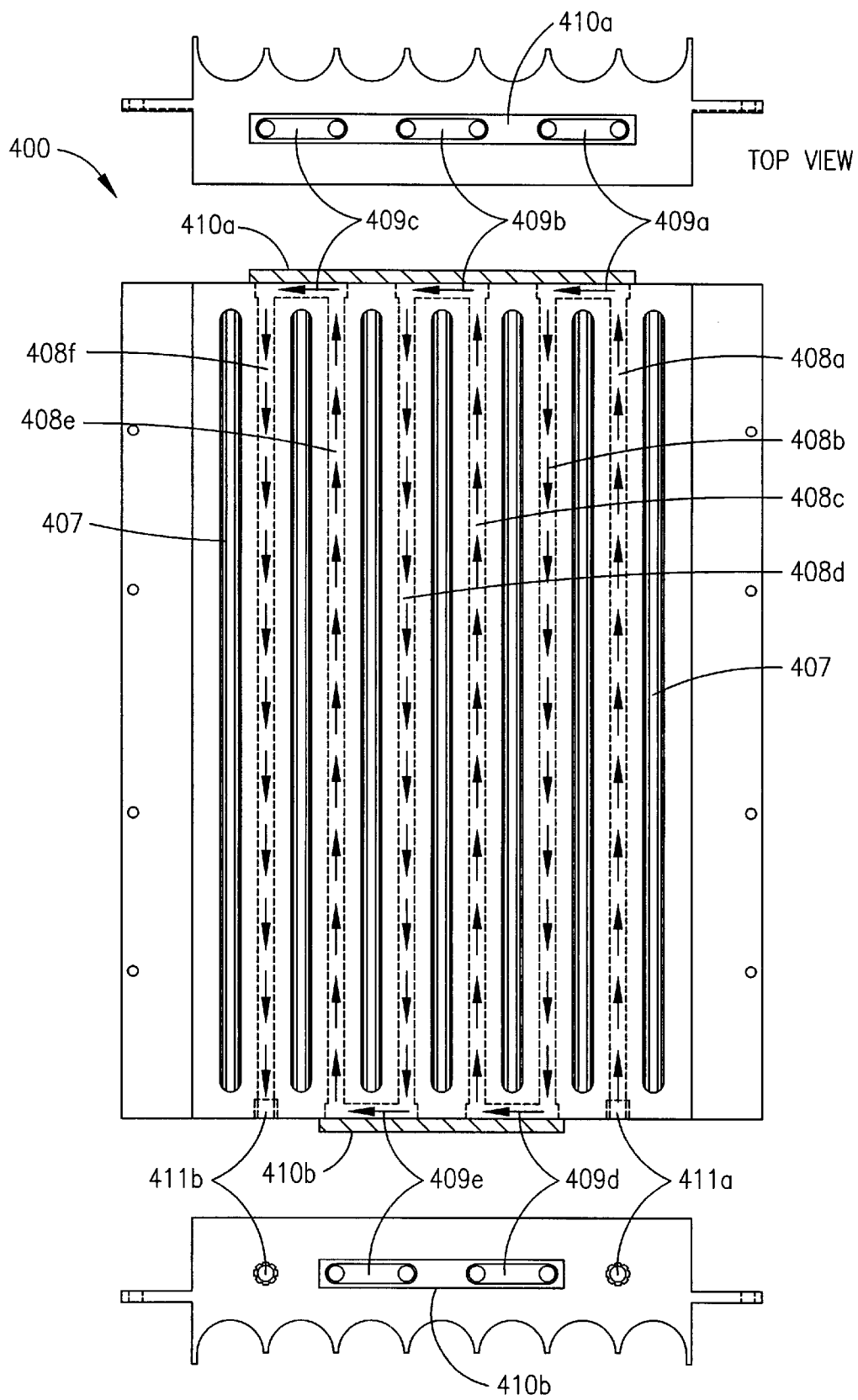
FIG. 18 is the side, top and bottom view of the side heater in accordance with the present invention.

As boat 46 is elevated by shaft 48 into upper chamber portion 22a, quartz ring 64 of seal plate 62 comes into intimate contact with an inner lip of O-ring structure 24, thereby stopping seal plate 62 in the position shown in FIG. 6. When quartz ring 64 is in such intimate contact with O-ring structure 24, seal plate 62 provides an almost complete seal between upper 22a and lower 22b portion of chamber 22, where portion 22a of chamber 22 becomes a reaction chamber in which layers of suitable material may be formed on wafers 44. By injecting a relatively small flow of inert gas such as argon or helium into the lower portion 22b, such inert gas must travel through the small gap between the hole in seal plate 62 and the shaft 48 on its way to being exhausted in upper portion 22a. This inert gas flow serves to greatly minimize the amount of reactive gasses the can enter the lower portion 22b from the upper portion 22a thereby effectively eliminating excessive and unwanted vapor deposition upon the heated parts in lower portion 22b. In addition, such containment of the expensive reactive gases within the process or upper portion 22a results in more efficient use of these gases. Further, this containment results in an effective reduction of the reaction chamber's volume thereby reducing the residence time (the average time it takes a molecule of gas to travel from the point of injection to its being exhausted on the opposite side of the chamber) of the reactive gases. For a number of typical CVD processes, excessive residence time can lead to unwanted reaction and the generation of sub-species and the unwanted incorporation of such sub-species into the CVD film that is being deposited. Seal plate 62 provides effective thermal isolation between reaction chamber 22a and lower chamber portion 22b. In addition, seal plate 62 also serves as a thermal diffuser for heat energy emitted from heating structure 550 and, in this manner, acts as an intermediate heat source for wafers 44. Further, seal plate 62 provides for the effective containment of the plasma within the upper portion 22a during plasma enhanced processing such as PECVD and in situ plasma cleaning and presence of seal plate 62 in conjunction with seal plate 508 associated with the upper heating structure 500 (FIG. 18) results in a symmetrical configuration which aids in producing a uniform plasma to obtain consistent and uniform plasma processing. The seal plate 62 can be either held at electrical ground in the case where the lifting rods 66 are made of conductive material such as titanium or the seal plate 62 can be electrically floating if the lifting rods are made of a non-conducting material such as quartz. Alternatively, seal plate 62 may be connected to the RF source.

Note that as lift carriage 620 approaches upper bellows disk 606, one or more rotation pins 637 attached to lift carriage 620 engage associated notches 638 formed in upper bellows disk 606 (FIG. 7). In this manner, the rotation pin(s) 637 transmit the rotation energy via the lower bellows disk 612 to the shaft 48 rather than via the bellows 610 thereby eliminating bellows wobble and fatigue of the bellows material (usually thin stainless steel) leading to premature failure.

Figure 12:
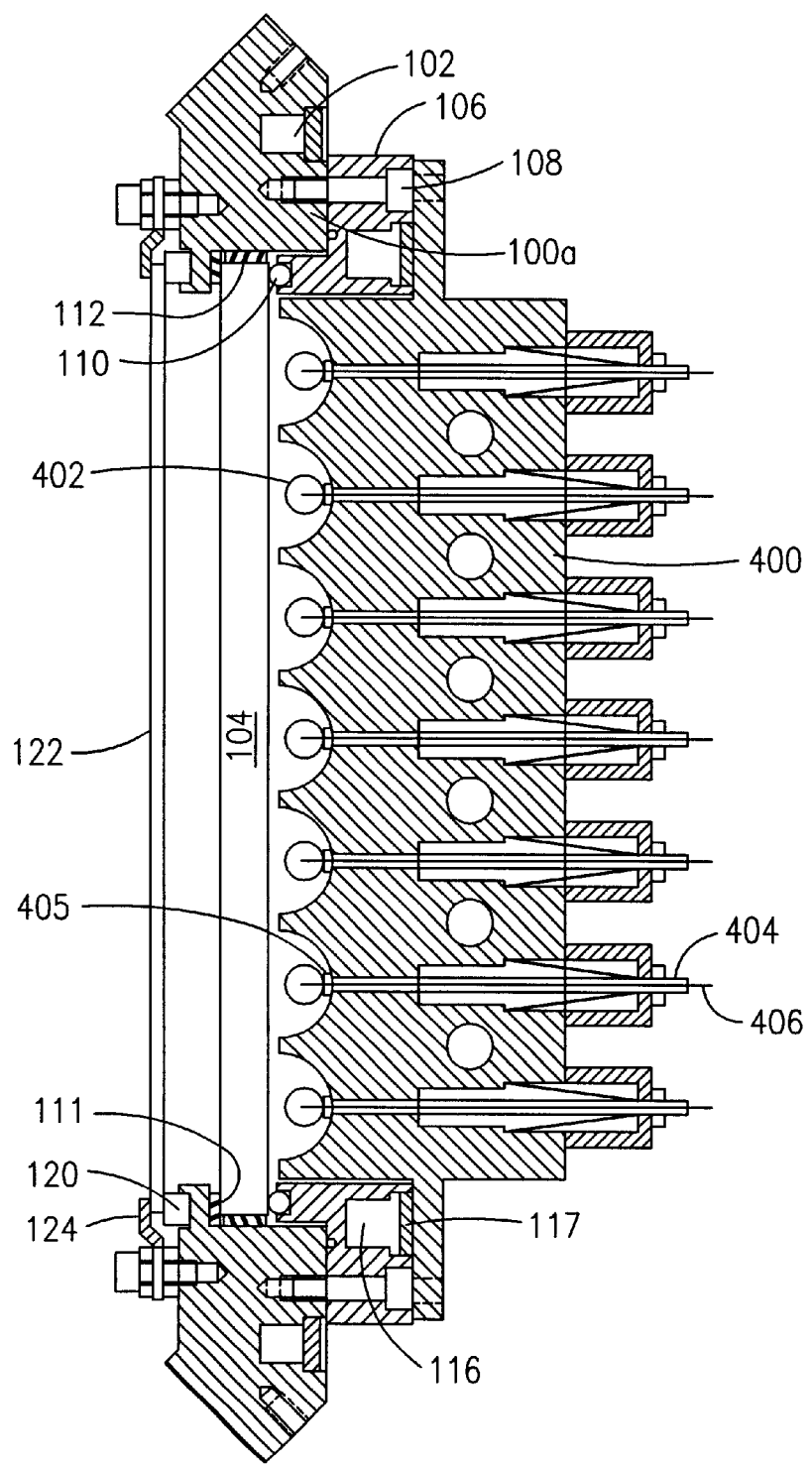
FIG. 12 is a top cross-sectional view of a wall of the upper section of the chamber of the reactor of FIG. 2.

Referring now to FIGS. 3 and 11–14, a heating structure 400 is positioned on an exterior surface of each of side walls 100a. Note that sidewalls 100a and 100b of process portion 22b of chamber 22 are welded together on the inside seams thereof and have formed therein ducts 102 through which water or other suitable liquid flows for cooling purposes. A quartz window 104 is securely positioned within each of walls 100a as shown in FIG. 12 by a water-cooled window clamp 106 which is fastened to side wall 100a by bolts 108. An O-ring type gasket 110 (constructed of a suitable material such as, for instance, viton, silicon rubber, or cal-rez graphite fiber) and strips 112 and gasket 111 of a similar suitable material are provided between quartz window 104 and side wall 100a and clamp 106 to ensure that the window 104 does not come in direct contact with either the side wall 100a or the clamp 106 to prevent the undue stress that would cause an implosion if the window 104 were in direct contact with the cooled side wall 100a or the cooled clamp 106 when the window 104 is hot and the chamber 22 is under vacuum. The combination of O-ring 110 and gasket 111 also completely vacuum seals quartz window 102 to side wall 100a. Milled channels or ducts (similar to 102) are formed in clamp 106 and strips of metal 117 are welded thereto to allow water or other liquid to flow through the ducts 116 for cooling the clamp 106.

Figure 13:
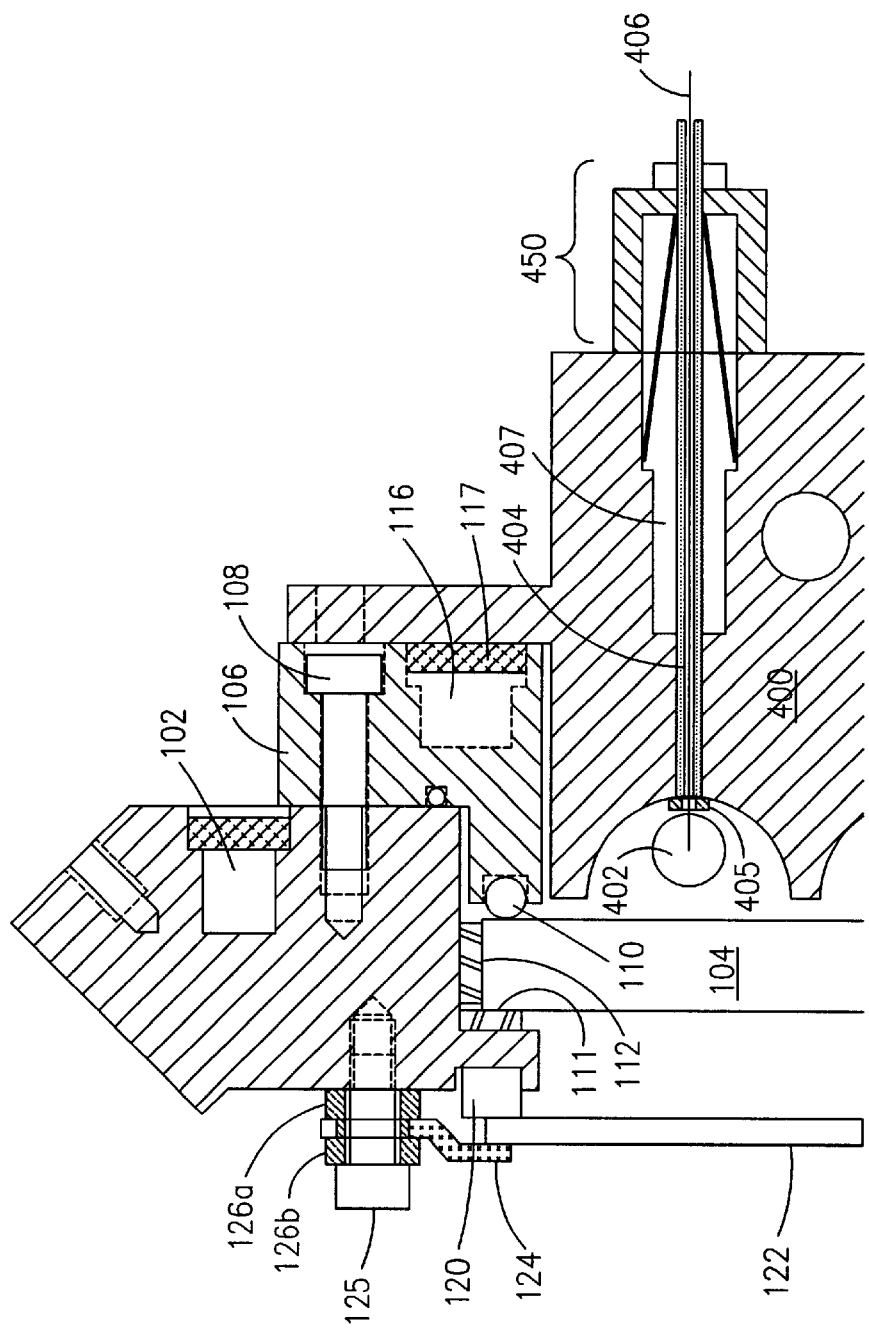
FIG. 13 is an exploded view of FIG. 12.

Heating structure 400 is mounted to window clamp 106 by bolts (not shown). In one embodiment, seven cylindrical tungsten halogen lamps 402 each having a piece of insulator tubing 404 made of ceramic or quartz and encasing its electrical lead wires 406 are positioned within heating structure 400 as shown in FIGS. 12 and 13. Between the lamp 402 and the heating structure 400 is positioned a shorter piece of insulating tubing 405 which has an outside diameter larger than the width of the tapered slot 407 in structure 400 through which the lead wire 406 and insulator tube 404 passes to prevent the lamp 402 from coming into contact with structure 400. Heating structure 400 may, in other embodiments, be modified in order to house a greater or fewer number of lamps 402. Those portions of the exterior surface of heating structure 400 which face the lamps 402 are polished and thereafter plated with successive layers of nickel and gold to maximize reflection.

Strips of quartz 120 or other suitable high temperature, electrically insulating material such as ceramic are positioned within a recessed grooves formed in sidewall 100a and which surround the entire opening in sidewall 100a. A thermal shield plate 122 made of a suitable high temperature material such as, for instance, graphite or silicon carbide is secured to side wall 100a by a plurality of retaining clamps 124 which are made from suitable high temperature material such as titanium. These clamps 124 are bolted to side wall 100a via bolt 125 and both the clamps 124 and the shield plate 122 are electrically isolated from the side wall 100a via the insulating (ceramic or other suitable material) shoulder washer 126a, the insulating flat washer 126b and the strips 120.

Figure 14:
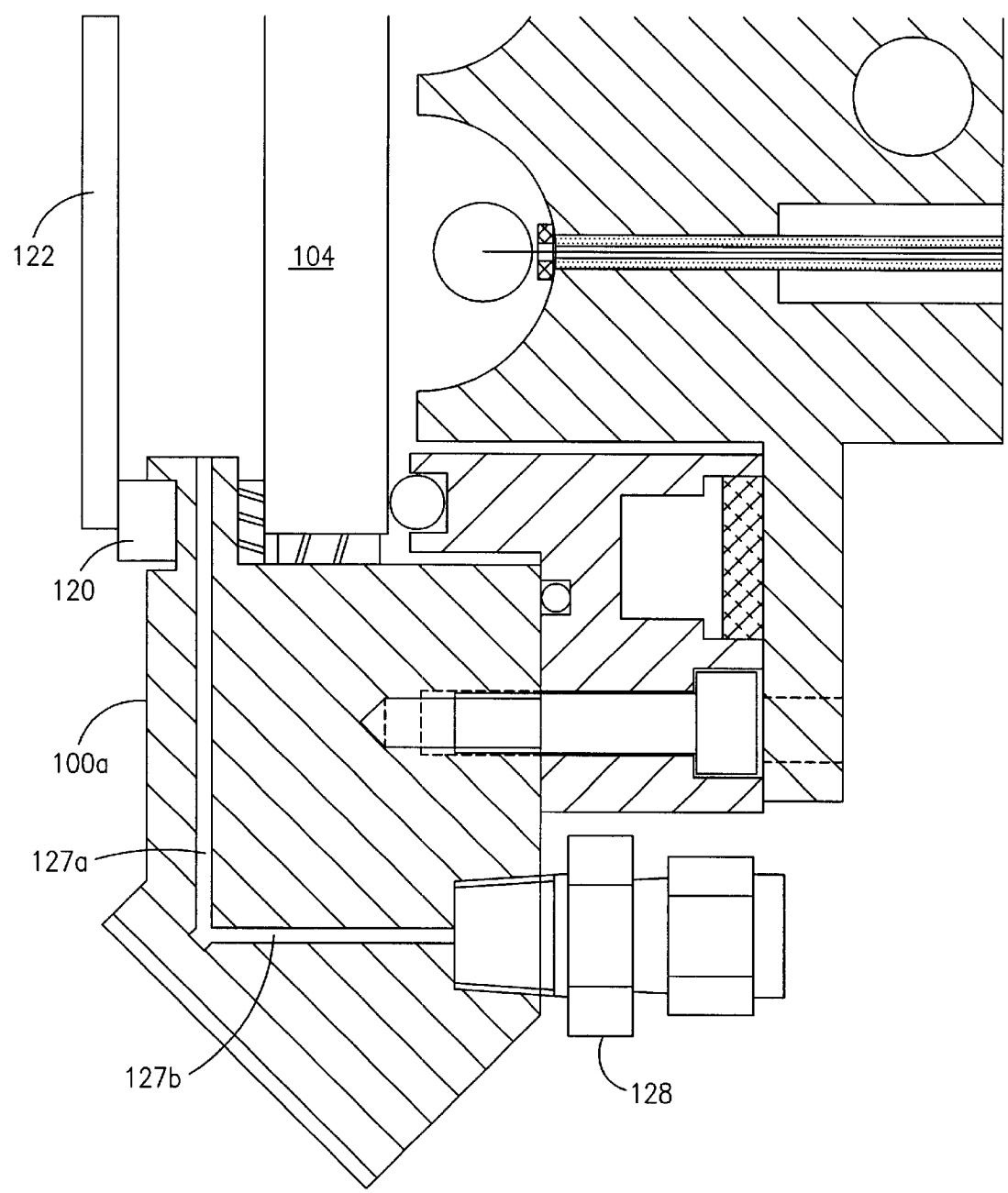
FIG. 14 is another exploded view of the wall of FIG. 12.

Shield plates 122 act as thermal plates to diffuse heat energy emitted from heating structures 400 to allow a more uniform distribution of heat energy to be provided to wafers 44. The shield plates 122 preferably have low thermal mass to allow for rapid thermal cycling of the shield plates 122. Inert gas such as argon is injected into the gap between the window 104 and the shield plate 122 via the gas channel in the side wall 100a made by holes 127a and 127b which join together to form the gas channel (FIG. 14). The gas is injected into the channel via fitting 128. The inert gas flows into the gap between the window 104 and the shield plate 122 and escapes out into the chamber 22a via the small gaps between the individual quartz strips 120 (alternatively small holes are drilled in the shield plates 122 to let the gas escape in the case where the individual quartz strips are replaced by a continuous single ring of quartz). The flow of the inert gas retards the reactant gases within chamber 22a from coming into contact with the quartz window 104, thereby preventing the unwanted deposition of films on the quartz window 104.

Figure 15:
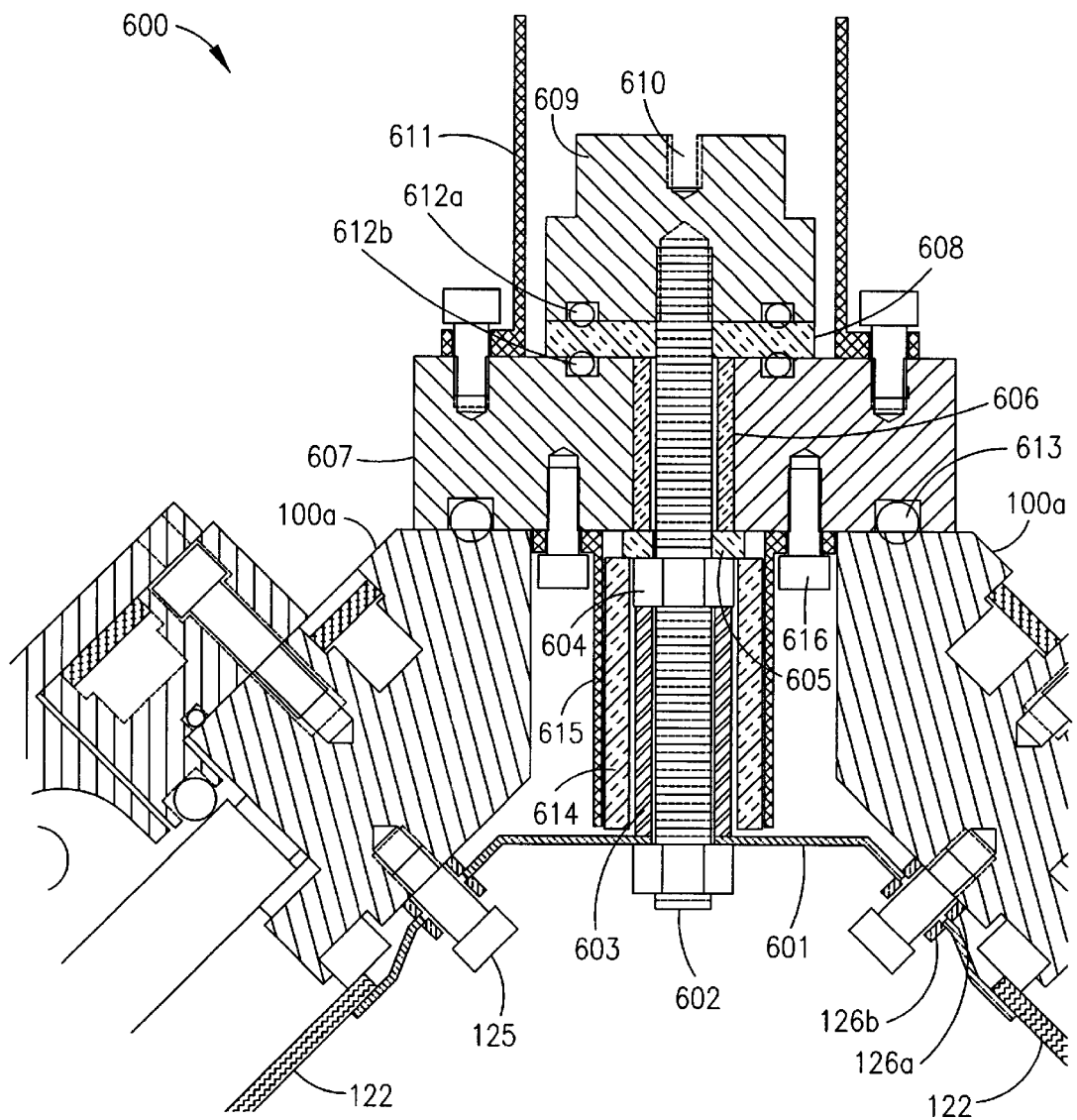
FIG. 15 is a cross-sectional view of the RF input structure in accordance with the present invention.
Figure 16:
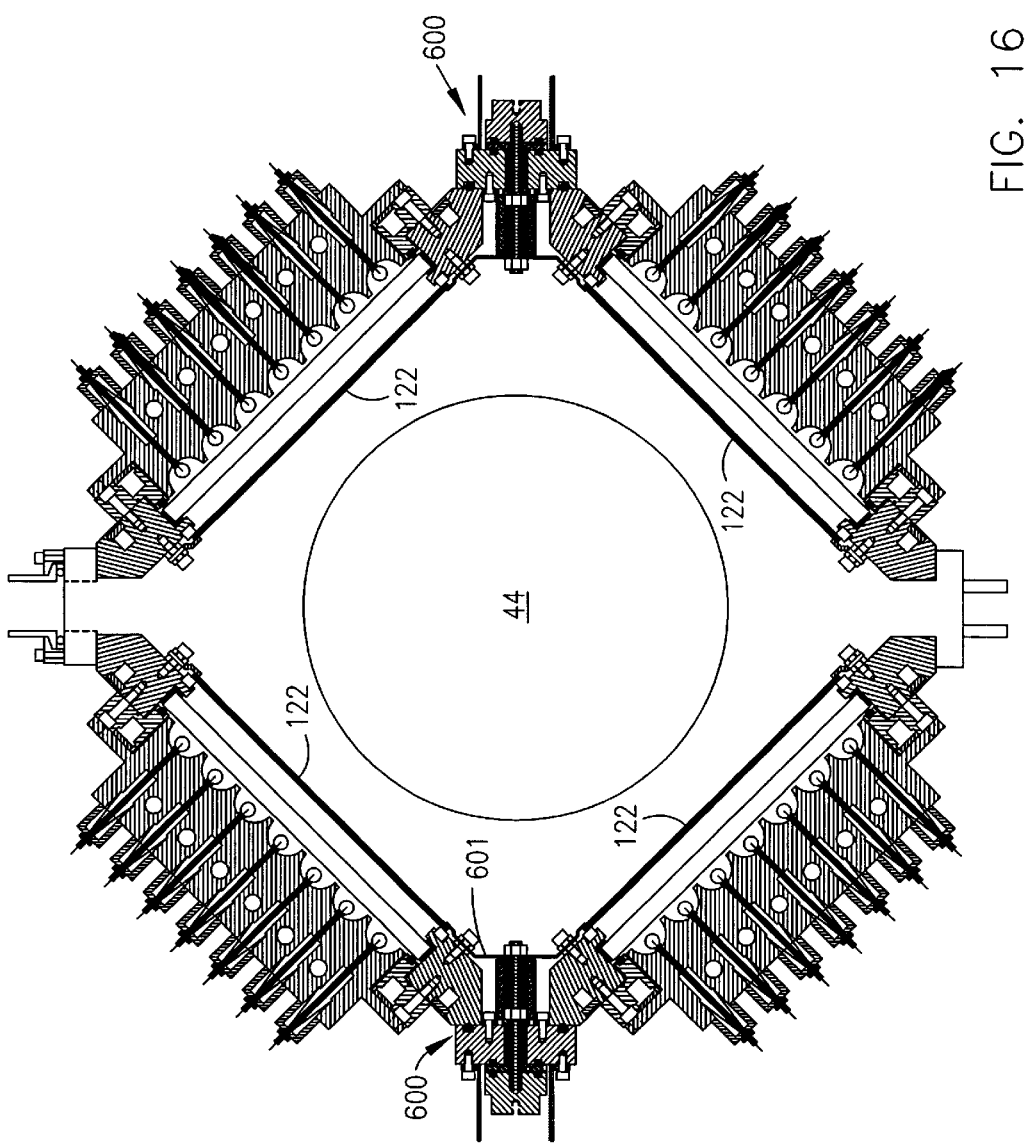
FIG. 16 is another cross-sectional view of the reactor's upper section.
Figure 17:
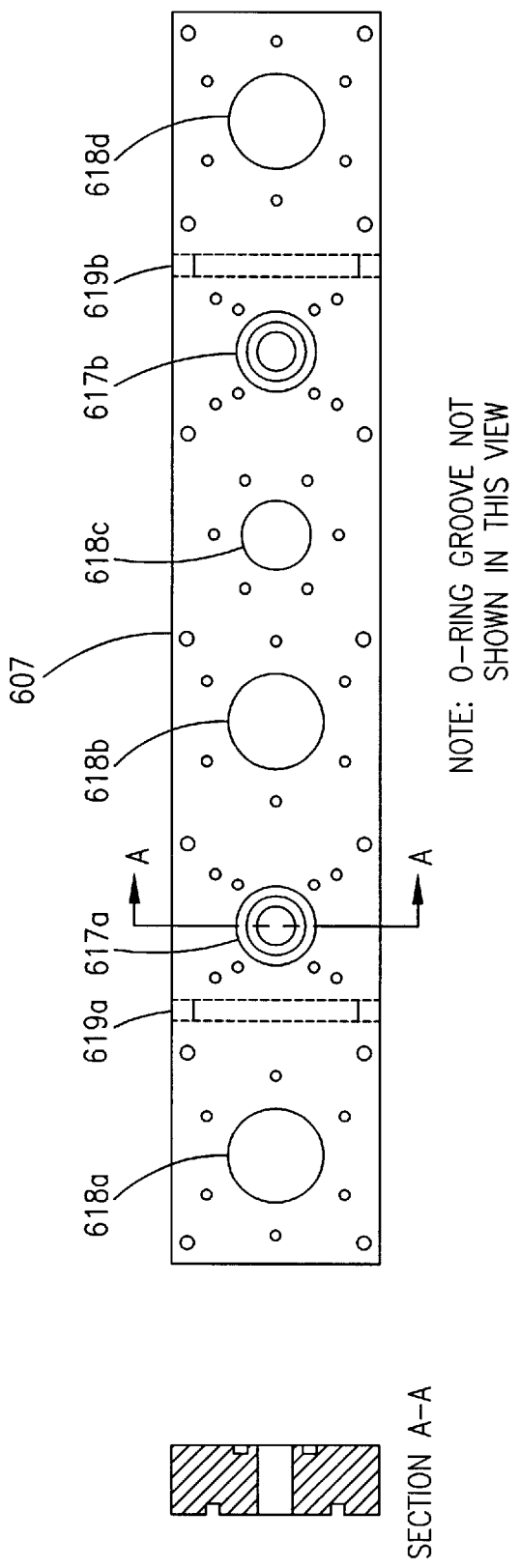
FIG. 17 is a side view with cross-section of the RF input seal plate.

As described above, all four of the shield plates 122 are electrically isolated from their associated side walls 100a and from each other. Referring to FIG. 15, two adjacent shield plates 122 are electrically connected together via the RF feedthrough structure 600 while the other two remaining shield plates are connected together via a feedthrough structure 600 on the opposite side of chamber 22a (FIG. 16) thereby forming a symmetrical arrangement of the two sets of connected shield plates 122 to facilitate the creation of a uniform plasma within chamber 22a. An electrical connection clip 601 made of suitable electrically conductive high temperature inert material such as titanium spans across the space between two adjacent side walls 100a and makes contact with the two adjacent shield plates 122. Two bolts 125 hold the clip 601 in place and the use of the insulating washers 126a and 126b provide electrical isolation between the clip and the side walls 100a. A bolt 602 passes through the center hole in clip 601 and through the clip support tube 603 which is made from suitable conductive material such as stainless steel, titanium, graphite, etc,. The clip support tube 603 rests against nut 604 and the bolt 602 continues through the insulating washer 605 (ceramic, etc,) and then through insulating tube 606 which is contained within a hole drilled through the RF input seal plate 607. The bolt 602 then passes through the external insulating washer 608 and is threaded into the RF connector 609 (note that part of the threads along the length of the bolt 602 have been previously ground off to provide a path for trapped gases to prevent virtual leaks). The RF input cable or strap (not shown) coming from the RF matching network (not shown) is bolted to the connector 609 via threaded hole 610. Surrounding the connector 609 and the RF input cable or strap is a metal enclosure 611, usually aluminum, bolted to the RF input seal plate 607 to prevent the escape of the RF energy which could interfere with aircraft and other radio signals in the atmosphere. An O-ring 612a vacuum seals the RF input connector 609 to the external insulating washer 608 which in turn is vacuum sealed to the RF input seal plate 607 via o-ring 612b. The RF input seal plate 607 which is bolted to the side walls 100a (bolts not shown) is vacuum sealed to the sidewalls 100a via O-ring 613. Surrounding the clip support tube 603 is the dark space insulating tube 614 which in turn is surrounded by the grounding enclosure 615 which is bolted to the RF input seal plate by bolts 616. In this manner, the RF energy is contained such that a plasma will not ignite in that region which would otherwise cause a hot spot which would greatly reduce the amount of RF energy being transmitted to the clip 601 and shield plates 122 and which would cause excessive and unwanted sputtering of material off of the clip support tube 603. FIG. 17 shows an end view of the RF input seal plate 607 in which is formed the holes, o-ring grooves and bolt patterns for mounting the RF feedthrough structure in two locations 617a and 617b. Two locations are provided for convenience only as only one feedthrough structure 600 is required one each of the opposite sides of chamber 22a. The unused location is vacuum sealed using a simple nut, bolt, cap and o-ring structure. The other holes 618a through 618d and their associated bolt patterns are fashioned to accept standard KF type vacuum fittings. These other holes 618a–618d are used for thermocouple feedthroughs, pressure transducers, view ports and other purposes. Two holes, 619a and 619b, are drilled through the RF input seal plate 607 and tapped on each end with pipe threads to accept fittings so that cooling fluid can flow through the seal plate 607 for cooling purposes. Referring to FIG. 16, the use of two RF feedthrough structures 600 on opposite sides of chamber 22a, rather than simply grounding the shield plates 102 opposite a single RF feedthrough structure 600, permits the use of a commercial RF switch (not shown) to switch the RF input energy from one side to the other in alternating fashion to produce more uniform removal rates of deposited material off of all four shield plates 122 during in situ plasma cleaning. In other embodiments, RF energy may be provided to shield plate 508 (FIG. 23) in a similar manner. Applying RF energy also to top shield plate 508 may result in more effective in situ plasma cleaning and PECVD processes. In still other embodiments, RF energy may be provided to the lower shield plate 62.

Figure 19:
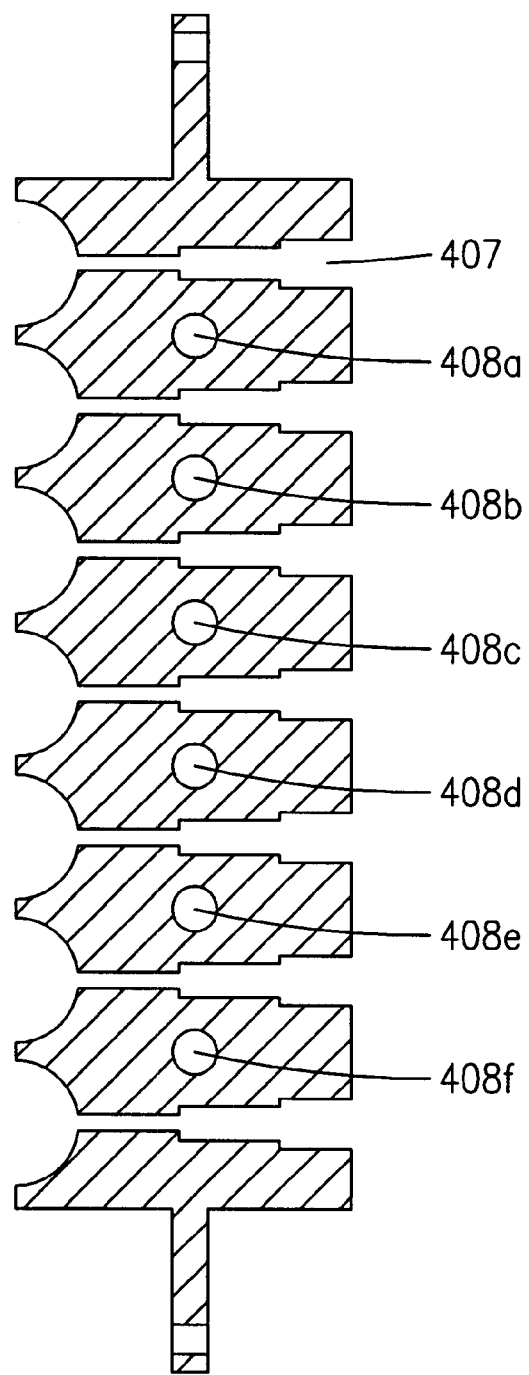
FIG. 19 is a cross-sectional view of the side heater.

Heating structures 400 may be cooled in a variety of manners. In one embodiment shown in FIGS. 18 and 19, vertical holes 408a–408f provided in structure 400 are connected together by horizontal slots 409a–409e which are covered by welded plates 410a and 410b to form a water path throughout structure 400, where water flow alternates upward and downward between adjacent ducts 408. Thus, water provided to duct 408a via a fitting threaded into the tapped portion 411a flows upward in duct 408a and downward in duct, upward in duct 408c, and so on. Water then flows through duct 408f and exits structure 400 via another fitting threaded into the tapped portion 411b.

Figure 20:
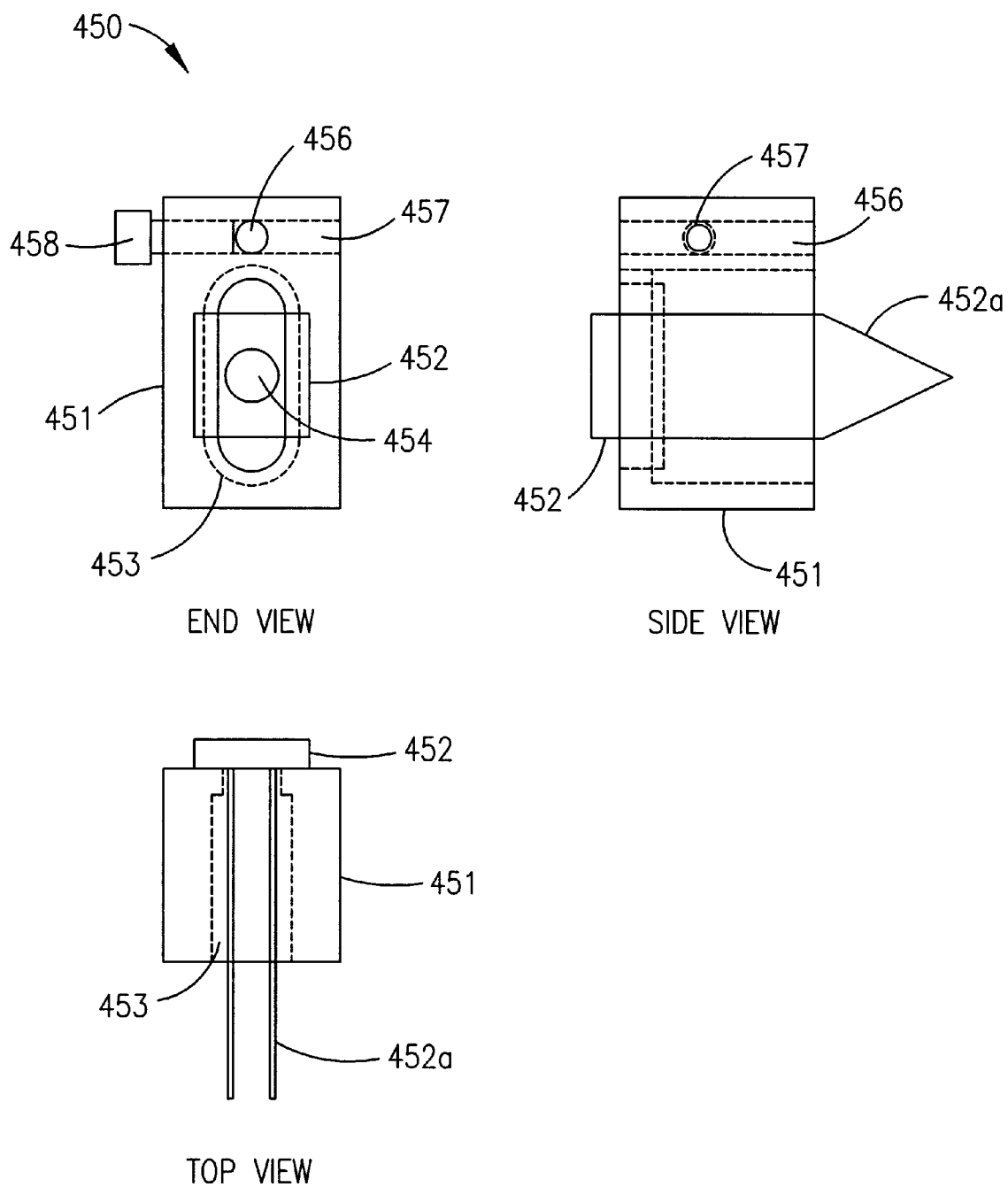
FIG. 20 shows the three views of the lamp clip assembly.
Figure 21C:
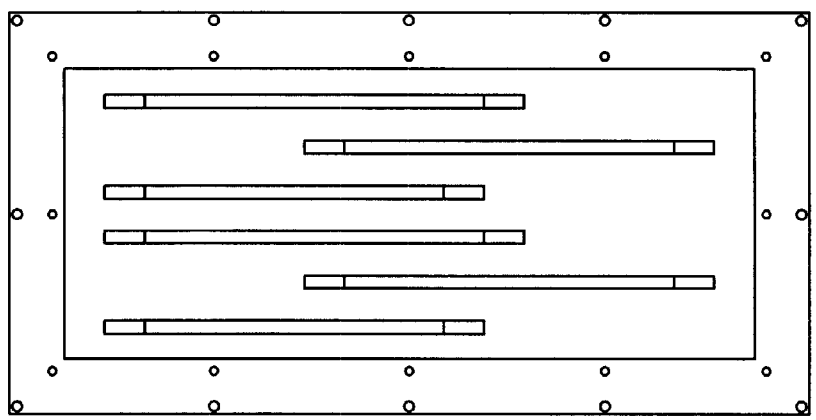
FIGS. 21A–21C and 22A–22F illustrate various positions in which heating elements may be placed in accordance with the present invention.
Figure 21B:
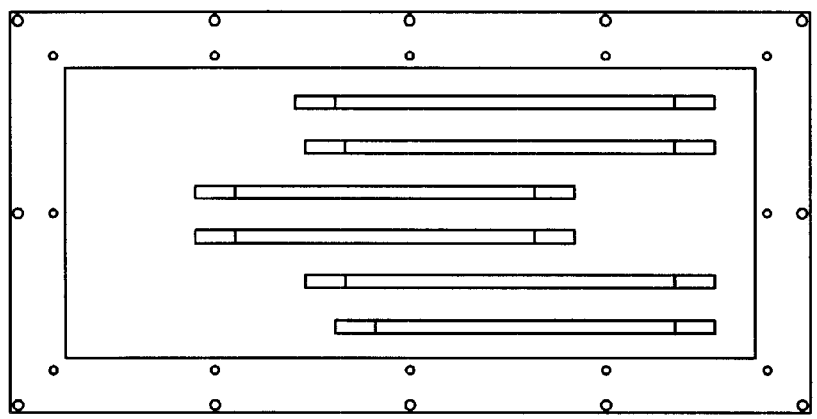
Figure 21A:
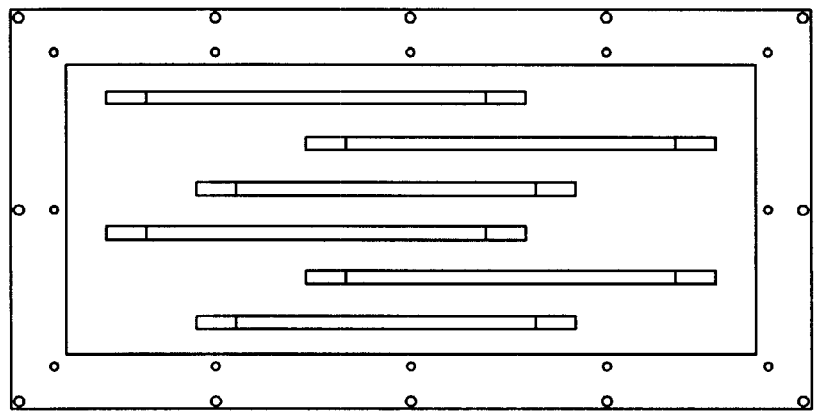

Tapered slits 407 provided within heating structure 400 allow lamps 402 to be easily positioned in various configurations within structure 400, a few of which are illustrated in FIGS. 21A–21C which show the use of six rather than seven lamps. Slits 407 facilitate easy insertion and removal of lamps 402 and also provide a path for air to flow between, and thereby further cool lamps 402. The forced air cooling is provided via a sheet metal enclosure and duct structure similar to that more fully described herein below for the top and bottom heater structures 500 and 550. FIG. 20 shows the lamp clip assembly 450 (also FIG. 13). The lamp clip base 451 fabricated from, for instance, aluminum has tapered slit 453 formed therein through which a commercial spring steel anchor 452 such as supplied by Grabco, Inc. (Rolling Meadows, Ill.) is inserted. The base 451 and clip 452 are positioned over the tapered slit 407 and a screw(not show) is inserted into threaded hole 45' which forces the legs 452a to spread apart thus securing the clip assembly 450 to a particular position over slot 407 (see FIG. 13). The insulating tube 404 and the lamp's lead wire 406 protrude through the base 451 via hole 456. A set screw or bolt 458 is threaded into tapped hole 457 to secure the insulating tube 404. Two lamp clip assemblies 450 are used for each lamp 402, one at either end. Since the anchor 452 is of spring material, the lamps 402 can be easily repositioned up and down the length of the tapered slit 407 by backing off on the screw in hole 454 and then re-tightening. In some embodiments, lamps 402 are arranged via electrical connection into two or more independently controllable zones. The flexibility in heating patterns afforded by the maneuverability of lamps 402 within structure 400 and the ability to independently control power to multiple zones of lamps 402 allows for maximum temperature uniformity across the surfaces of wafers 44. Minimizing temperature gradients across the surfaces of wafers 44 is especially important in preventing warping and slipping during rapid temperature ramping for those processes conducted at temperatures exceeding approximately 800° C. The multiple zones provided by both the physical placement of the lamps and selective grouping of lamps via electrical connection allows for directing different amounts of heat to various portions of the wafer boat 46 and wafers 44 during temperature ramping. For instance, it may be desired to direct more heat towards the bottom of wafer boat 46 during temperature ramp up to produce a more uniform thermal gradient up and down the length of boat 46 to avoid warping the wafers 44 or causing crystal slippage within the wafers 44.

Figure 22D:
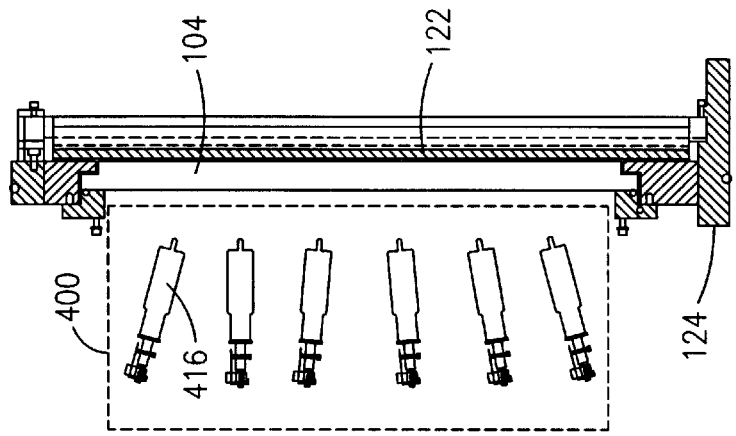
Figure 22C:
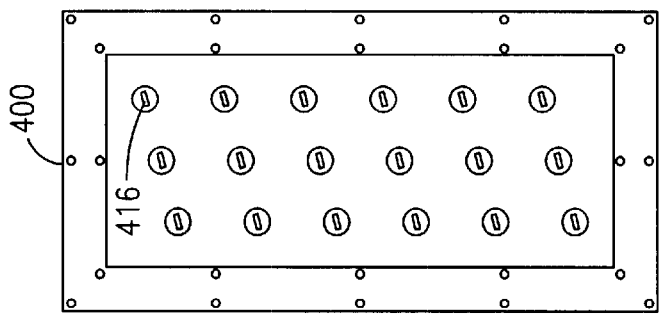
Figure 22B:
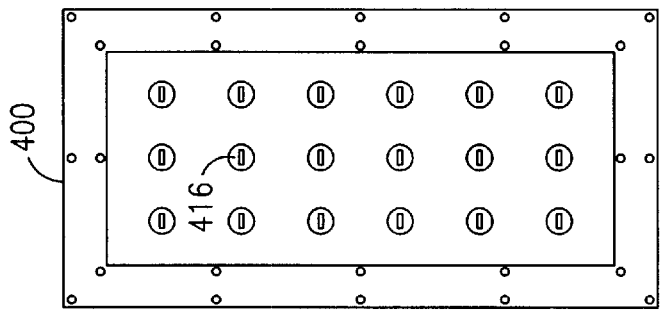
Figure 22A:
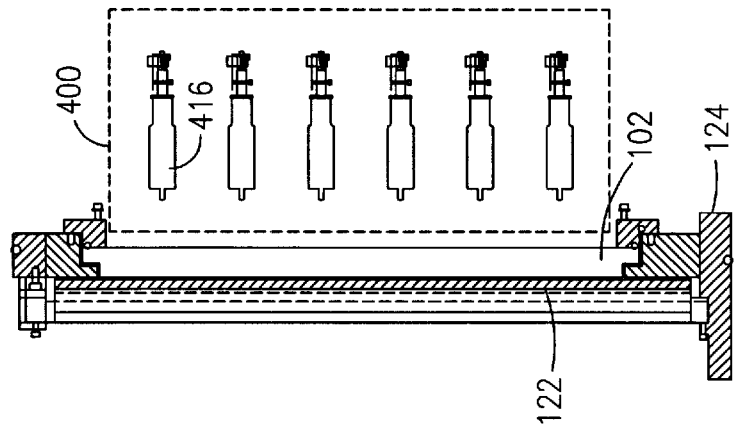
Figure 22E:
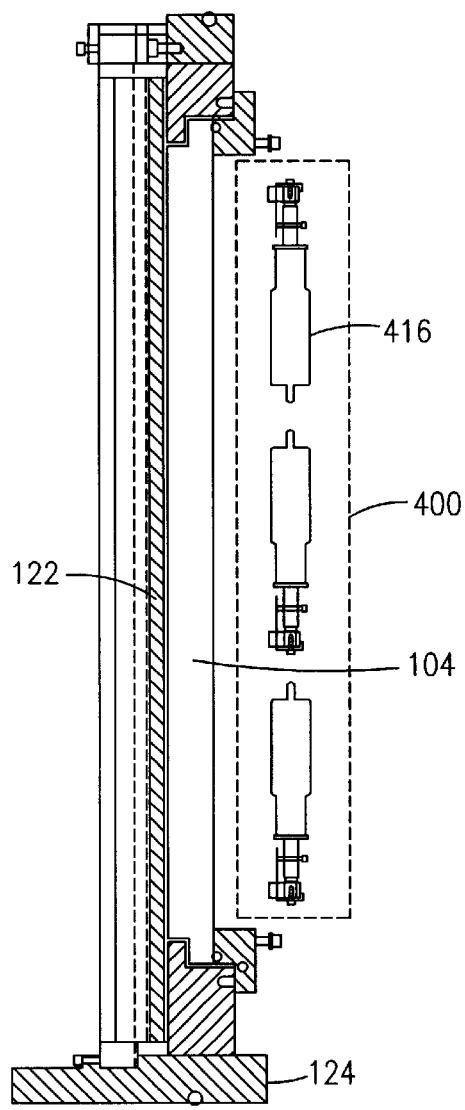
Figure 22F:
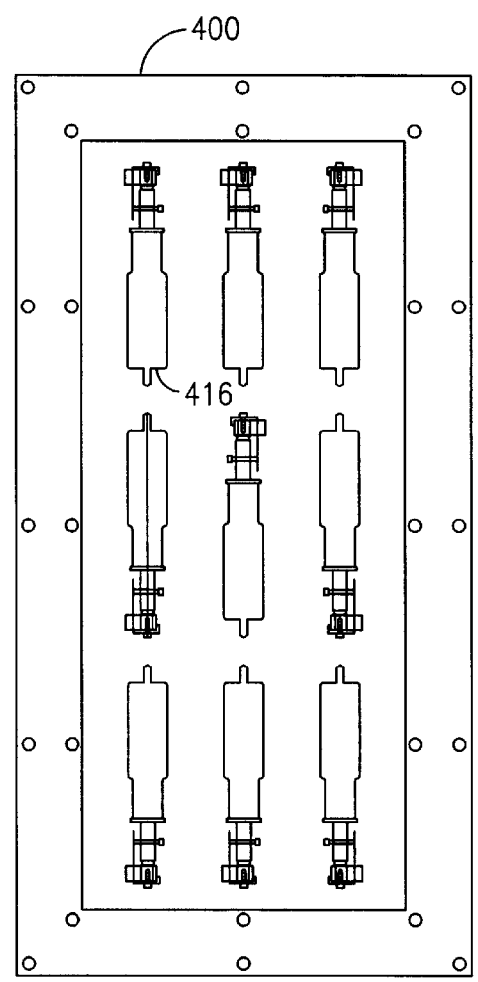

In other embodiments, socket-type lamps 416 may be employed in place of cylindrical tungsten halogen lamps 402, as shown in FIGS. 22A–22F. Lamps 416 may be positioned at various angles with respect to quartz window 104. For instance, the embodiment shown in FIGS. 22A–22B shows lamps 416 positioned perpendicular to quartz window 104, while lamps 416 in the embodiment shown in FIGS. 22C–22D are positioned at various adjustable angles with respect to quartz window 104. The embodiment shown in FIGS. 22E–22F includes lamps 416 positioned parallel to quartz window 104. Although the use of socket-type lamps 416 may improve the flexibility with which heat energy is provided to wafers 44, larger and more expensive heating structures 400 are required to house socket-type lamps 416.

Figure 23:
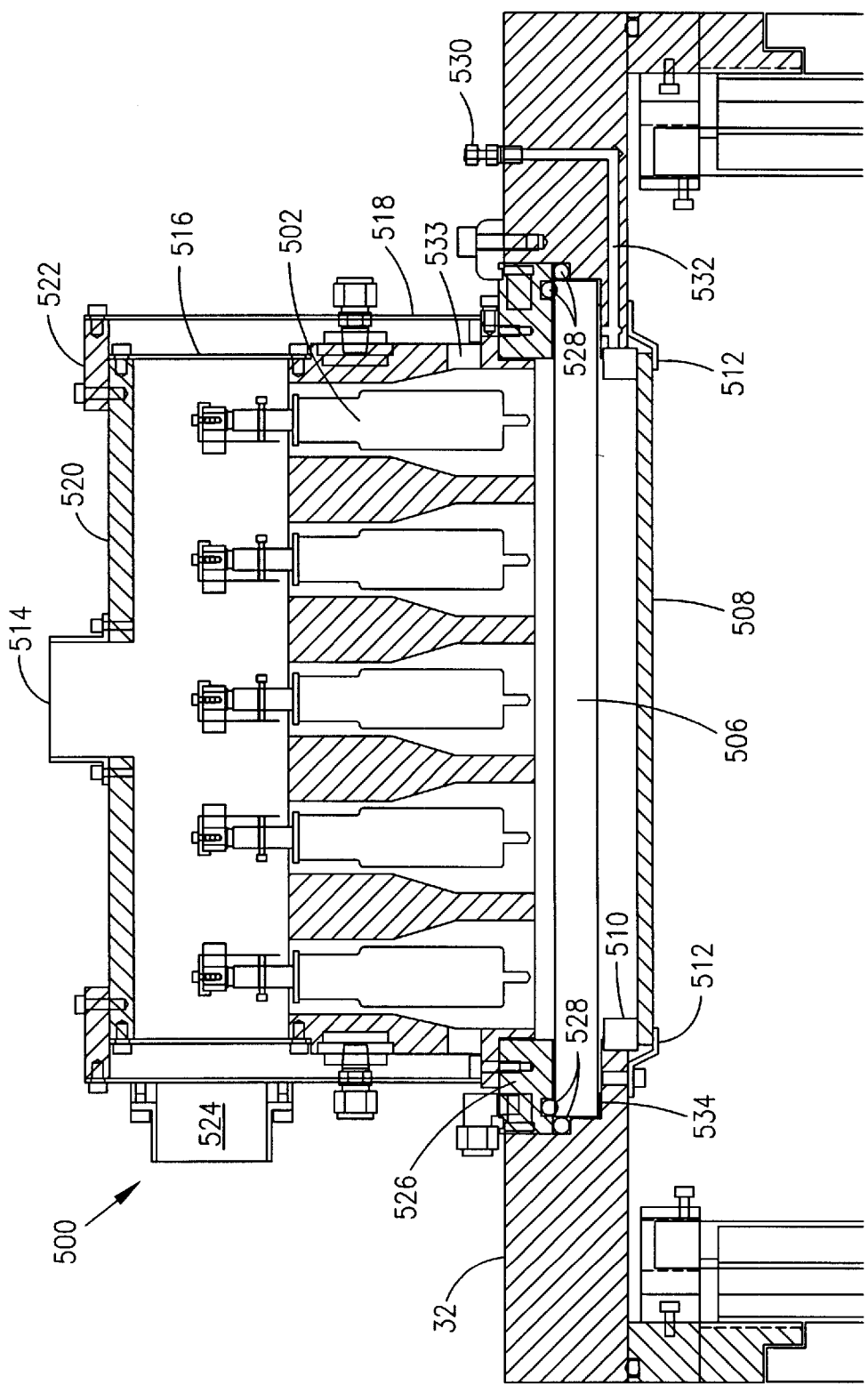
FIG. 23 is a cross-sectional view of a heating element positioned above the chamber within the reactor of FIG. 2.
Figure 24:
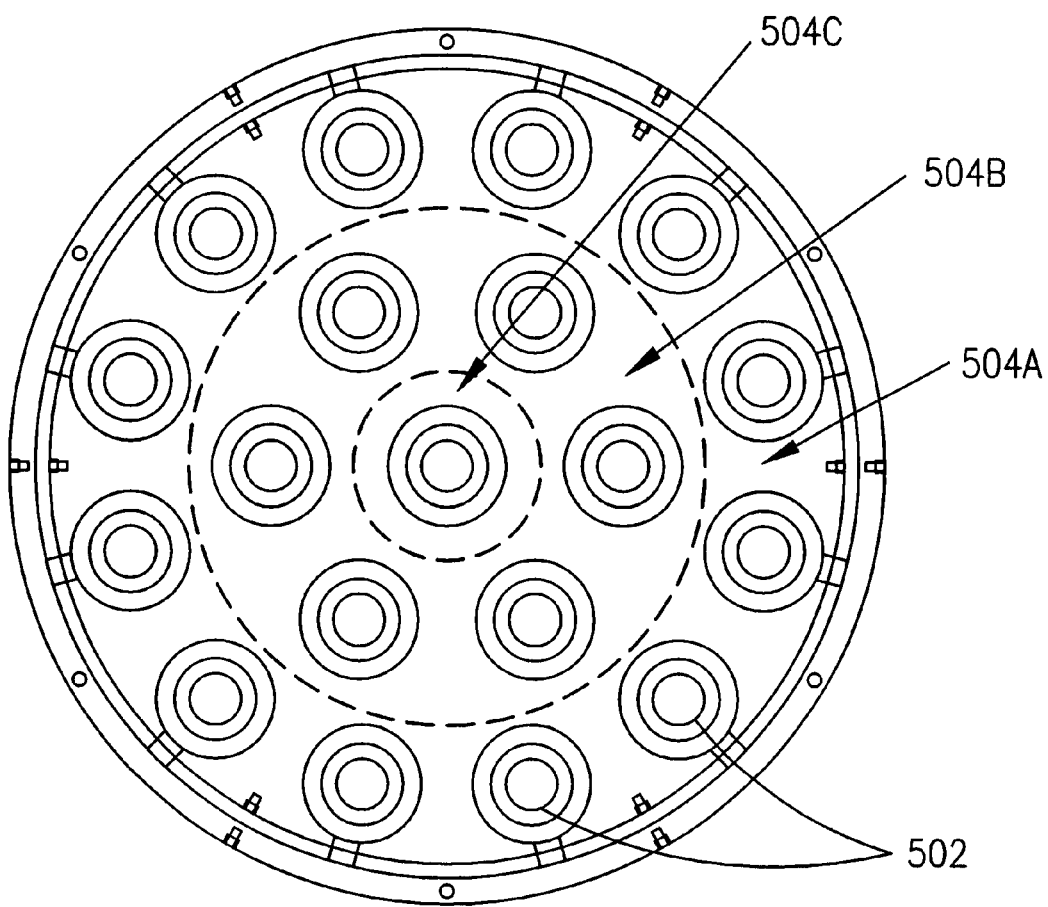
FIG. 24 illustrates the three zones of lamps of heating element of FIG. 23.

Referring now to FIGS. 23 and 24, a water-cooled upper heating structure 500 includes nineteen apertures into which nineteen associated socket-type lamps 502 are positioned. In some embodiments, lamps 502 are two-kilowatt tungsten halogen lamps. Referring to FIG. 23, lamps 502 are arranged into three concentric zones 504A, 504B, and 504C, where zone 504A contains twelve lamps 502 positioned about the periphery of structure 500, zone 504C contains one lamp 502 at the center of structure 500, and zone 504B contains six lamps 502 intermediate lamps 502 in zones 504A and 504C. Power may be independently provided to the lamps 502 in each of zones 504A–504C.

Upper heating structure 500 is aligned with an opening in top plate 32 into which a quartz window 506 is provided, as shown in FIG. 23. A shield plate 508 is mounted against a quartz ring 510 by clips 512. Shield plate 508, which is preferably made of a suitable high temperature material and has low thermal mass, diffuses heat energy generated by lamps 502. Clips 512 should be constructed from a suitable high temperature material. An air hose (not shown) is connected to an air inlet 514 and forces air flow within inner walls 516 and then into the interior of structure 500 to cool lamps 502. Inner walls 516 is bolted to a top plate 520 which, in turn, is secured to outer wall 518 by a metal ring 522. The air, having cooled lamps 502 and the electrical wiring associated therewith, as well as quartz window 506, exits structure 500 through holes 533 and then exits via a duct 524.

A water-cooled clamp ring 526 secures heating structure 500 to top plate 32 of reactor 20 and also serves to secure quartz window 506 in place. O-rings 528 vacuum seal quartz window 506 to top plate 32. A cushion or gasket 534 made from suitable material such as graphite or silicon rubber is positioned around the bottom periphery of window 506 to prevent the hot window from coming into direct contact with the cooled top plate 32. Inert gas is introduced into the spacing intermediate quartz window 506 and shield plate 508 via an inert gas fitting 530 and associated gas duct 532 formed within top plate 32.

Figure 25:
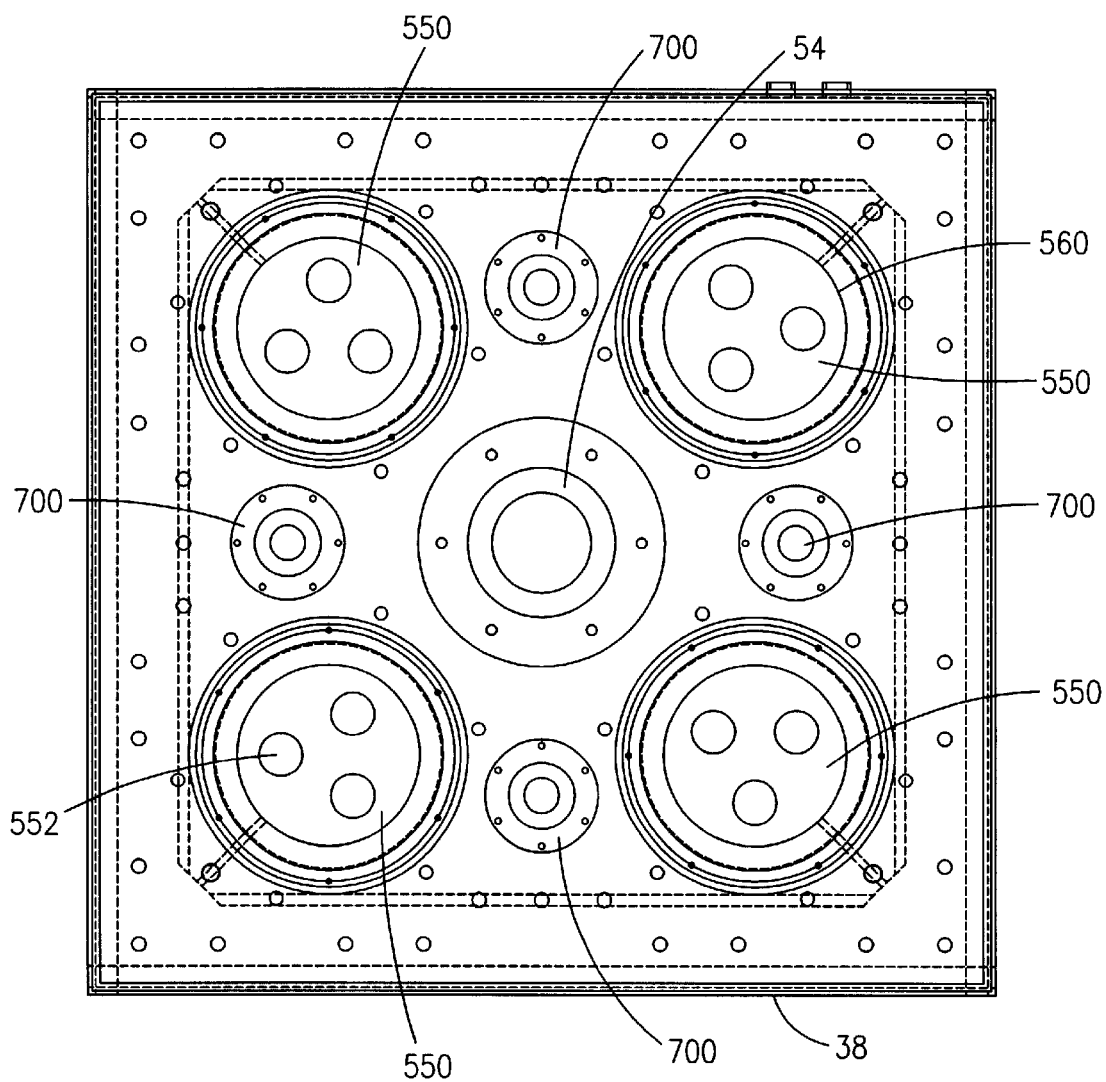
FIG. 25 illustrates the heating element housings positioned below the chamber within the reactor of FIG. 2.
Figure 26:
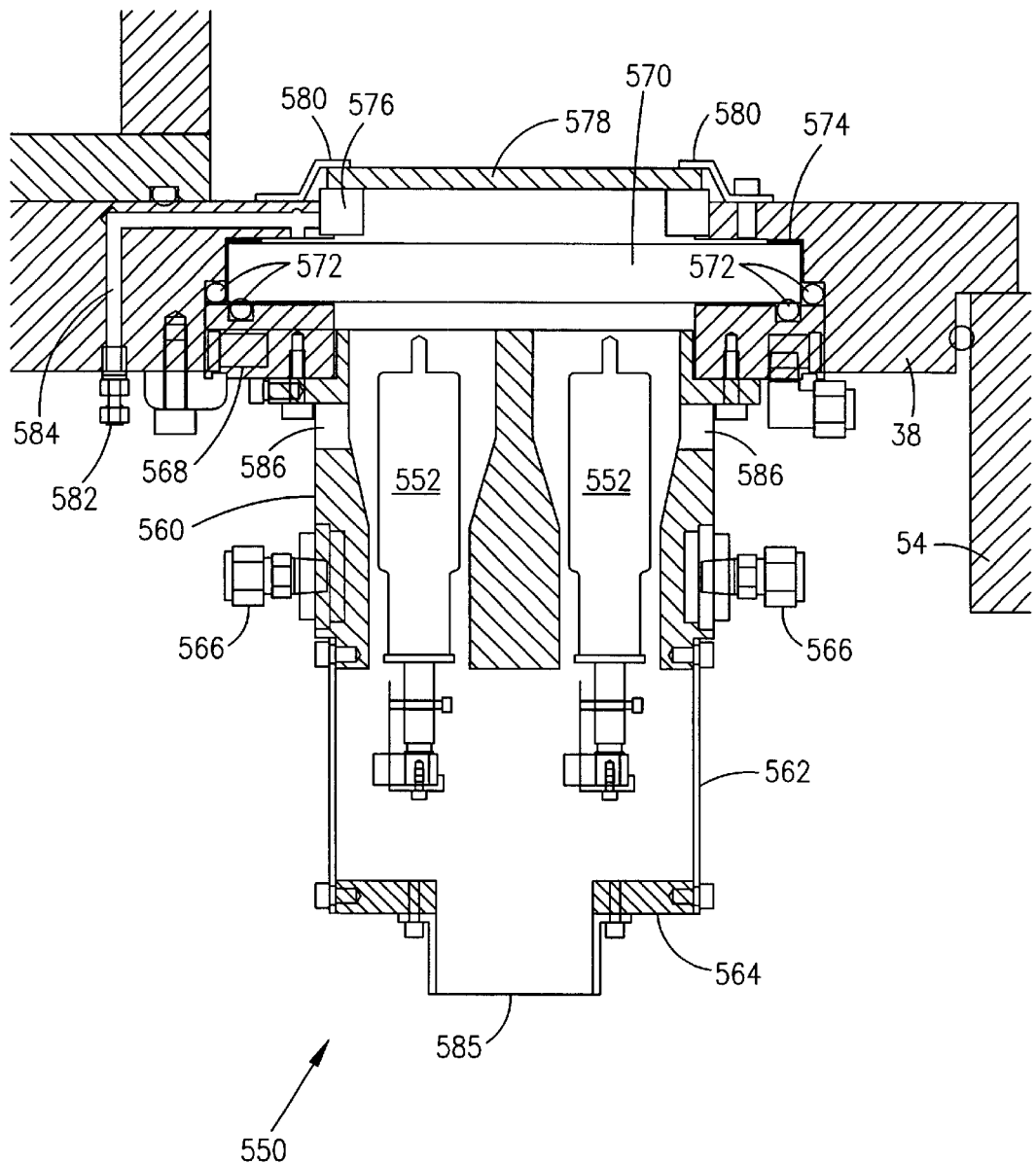
FIGS. 26 and 27 are cross-sectional views of one of the heating elements positioned below the chamber within the reactor of FIG. 2.

Referring now to FIGS. 25 and 26, lower heating structures 550 are similar in construction to upper heating structure 500. In one embodiment, four such lower heating structures 550 are attached to bottom plate 38 with each having lamp casings 560 containing three lamps 552. The lower heating structures 550 are arranged about the lifting mechanisms 700 with the ferrofluidic seal 54 in the middle. In some embodiments, lamps 552 are two-kilowatt tungsten halogen lamps. Note that in other embodiments a different number of lower heating structures 550 may be provided, and that lamp casings 560 may contain a greater or fewer number of lamps 552.

Each of water-cooled lamp casings 560 includes a sheet-metal cover 562 (FIG. 26). Attached to an inner circumference of cover 562 is a bottom plate 564. An air duct 585 is provided to allow forced air to circulate around the lamp sockets and wiring, the lamps 552 and the quartz window 570 for cooling purposes. The forced air exits via holes 586. Water inlets 566 are provided in casing 560 to allow water or other liquid to be pumped therein for further cooling of the casing 560. Casings 560 are secured to bottom plate 38 by a water-cooled clamp ring 568 which also secures a quartz window 570 in position. O-rings 572 vacuum seal quartz window 570 to bottom plate 38. A gasket 574 ensures that the quartz window does not come into direct contact with the water cooled bottom plate 38. A quartz ring 576 which nests into a recess in bottom plate 38 supports a shield plate 578 and serves to minimize heat loss from the shield plate 578 to the bottom plate 38. High temperature clips 580 made from metal or other suitable material secure shield plate 578 in position just above quartz window 570. An inert gas fitting 582 and associated duct 584 nearly identical in construction to respective inert gas fitting 530 and duct 532 of structure 500 are formed in bottom plate 38.

Figure 27:
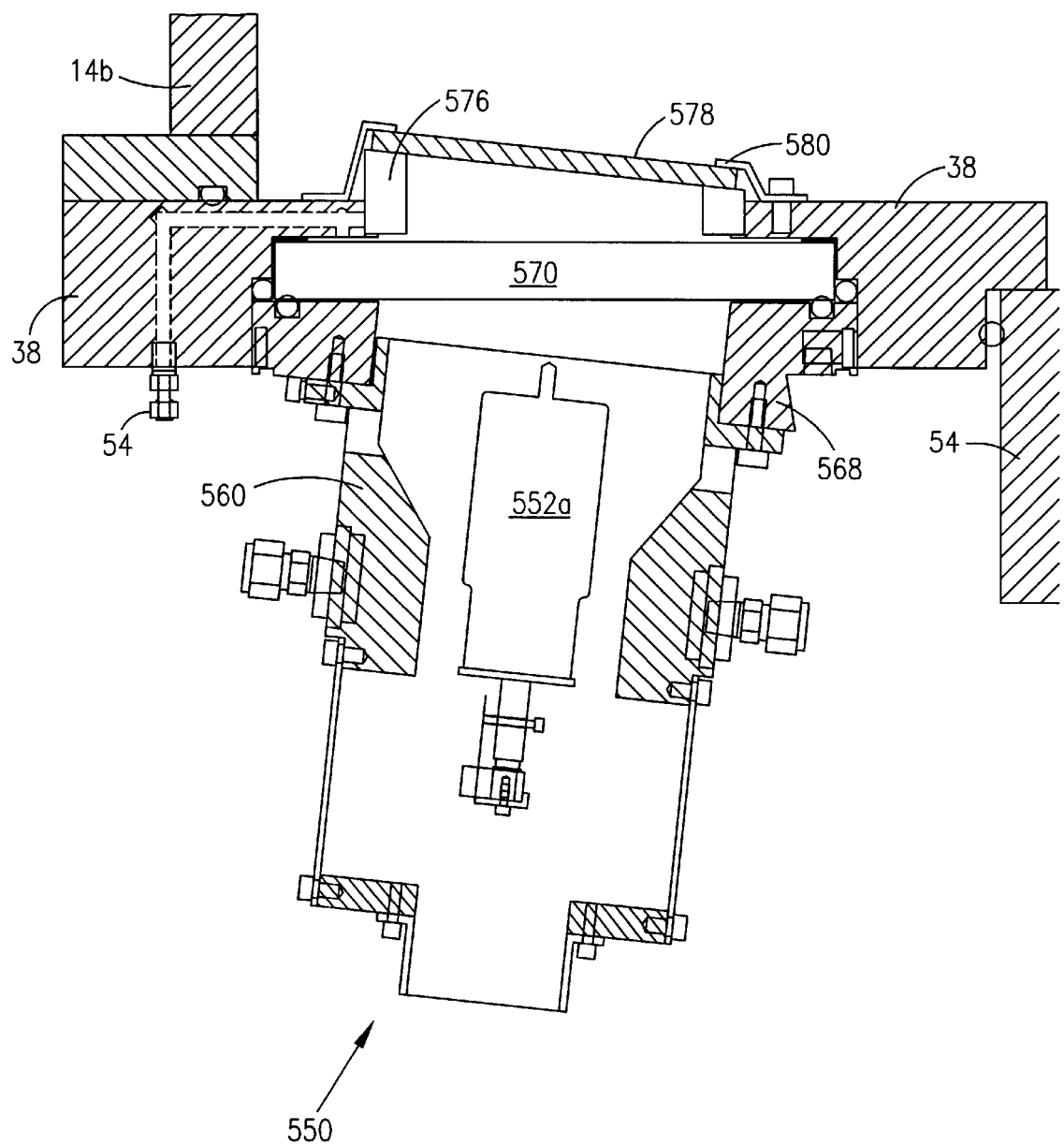

In other embodiments, one or more of casings 560 may be mounted to bottom plate 38 at some predetermined angle, as illustrated for instance in FIG. 27, to provide further flexibility in directing the heat from the lower heating structures 550 towards different areas within the reactor 20. Note that in the embodiment shown in FIG. 27, casing 560 contains one high-powered lamp 522a, as opposed to three of lamps 552. Note that the shapes of respective ring clamp 568 and quartz ring 576 will differ depending upon the particular angle at which their associated casing 560 is attached to bottom plate 38. The flexibility in the positioning of casings 560 allows for a more uniform distribution of heat to be provided to wafers 44 being processed in accordance with the present invention.

Temperature readings of wafers 44 obtained using suitable temperature sensing devices are provided as feedback to one or more temperature controllers which, in response thereto, adjust the intensity of one or more associated zones of lamps 402, 502, and 552 within respective heating structures 400, 500, and 550 in a well known manner. Suitable temperature controllers are available from Eurotherm, Inc of Reston, Va. In some embodiments, feedback temperature readings may be provided to a computer, where the manipulation of power provided to the lamps, and thus the temperature of wafers 44 within reactor 20, is implemented in a well known manner by PID control software operating in association with the computer.

Some embodiments employ as the temperature sensing device a plurality of thermocouples 136. Referring to FIG.

Figure 29:
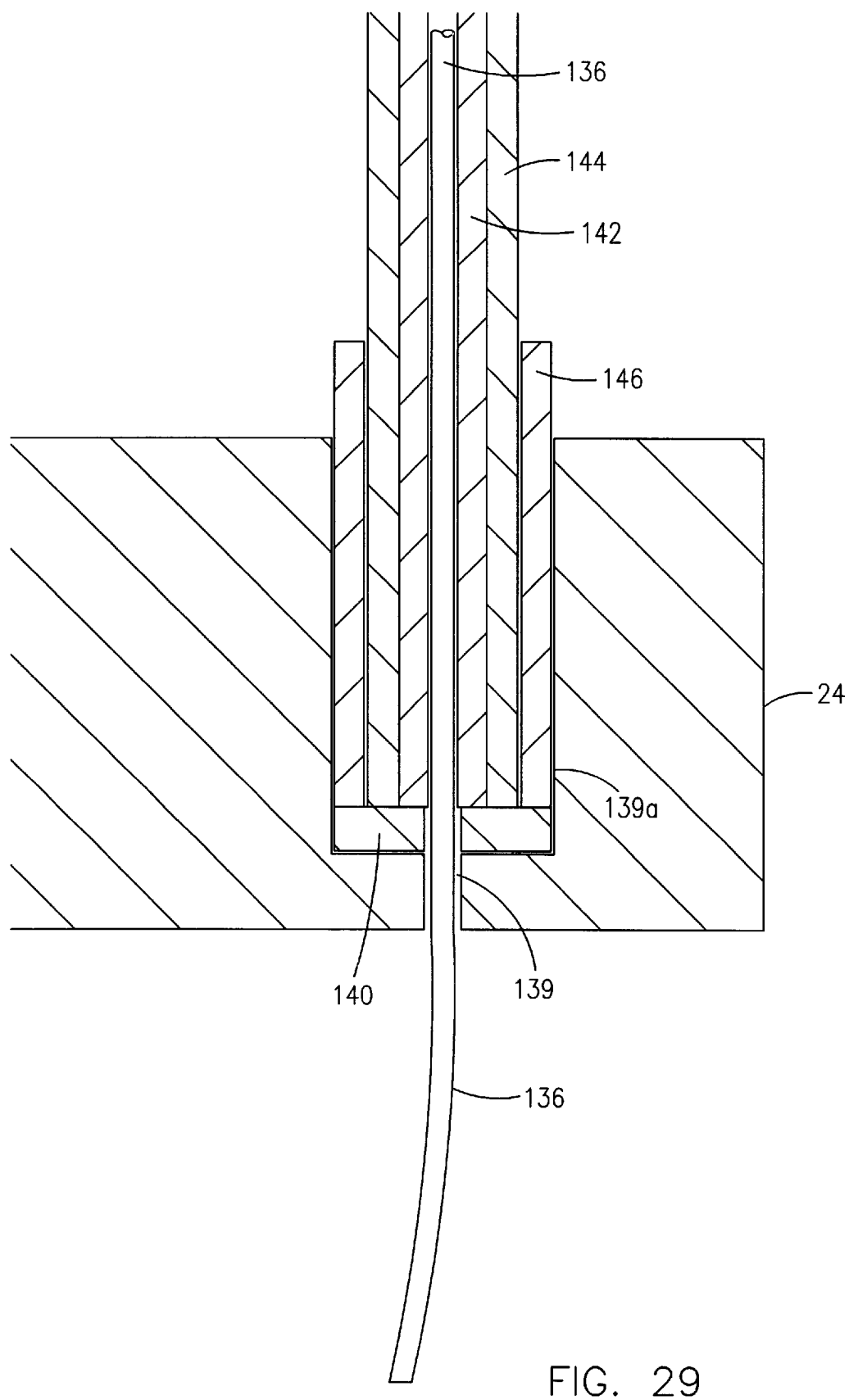

28, a thermocouple 136 enters reactor 20 through a vacuum feedthrough 138 attached to side wall 34 and continues into the reaction chamber through a hole 139 and associated opening in O-ring structure 24. Referring also to FIG. 29, thermocouple 136 is a metal sheathed type encapsulated by concentric layers of a quartz or ceramic tubing 142 and a graphite, silicon carbide, or other high temperature tubing 144. The end of the metal sheathed thermocouple is completely encapsulated by tubing layer 142 to prevent a glow discharge within reaction chamber 22a from contacting the thermocouple 136. The end of tubing layers 142 and 144 are aligned and situated within a quartz or ceramic tube 146 all of which rests upon a quartz or ceramic washer 140 provided within counterbore 139a. In this manner, the conduction of heat from the thermocouple 136 and the tubing layers 142 and 144 is minimized. In other embodiments, the thermocouples 136 may be encased in only one layer of tubing made of quartz, ceramic, graphite, silicon carbide or other suitable material. In still other embodiments, the sheathed thermocouples 136 may not be encased at all, however, in some cases for particular thermocouple 136 locations, an unencased thermocouple's thermal response time may be too fast for properly controlling the temperature via the PID controller. In addition, the thermocouples 136 may enter the reaction chamber 22a via a feedthrough attached to a hole or holes in seal plate 607 that are not being used for the RF feedthrough structure 600.

Figure 28:
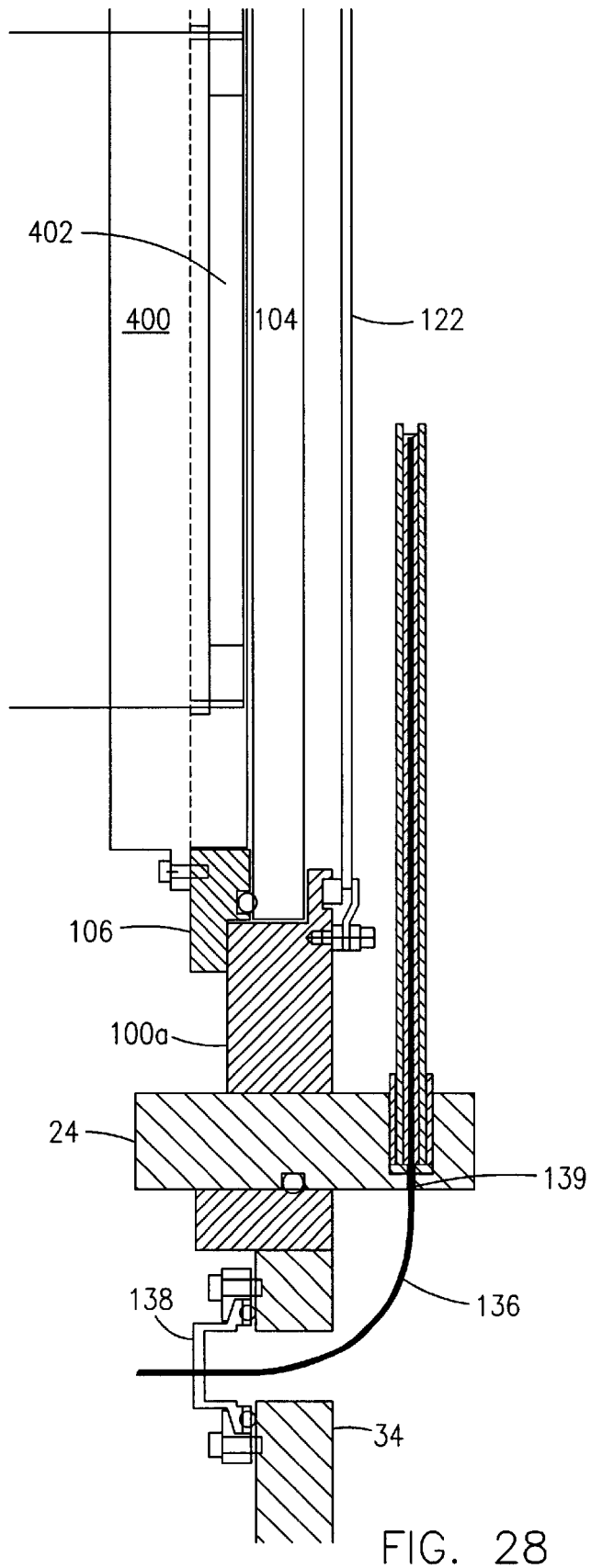
FIGS. 28 and 29 are cross-sectional views of a thermocouple structure in accordance with the present invention.

Although FIG. 28 shows only one thermocouple 136 for simplicity, it is to be understood that any number of thermocouples 136 may be employed at various positions within reactor 20 in order to increase the accuracy with which wafers 44 are maintained at a constant and uniform temperature and the accuracy with which wafers 44 are ramped up to and down from such constant and uniform temperature to avoid warpage or crystal slippage of wafers 44. In some embodiments, thermocouples 136 may be positioned within shield plates 122, 508 and 578.

In other embodiments, temperature sensing may be accomplished using pyrometry. In such embodiments, one or more pyrometers are mounted in suitable locations about reactor 20 and provide feedback indicative of the temperature of wafers 44 to one or more temperature controllers which, as discussed above, adjust the intensity of one or more associated zones of lamps 402, 502, and 552 within respective heating structures 400, 500, and 550.

Figure 30:
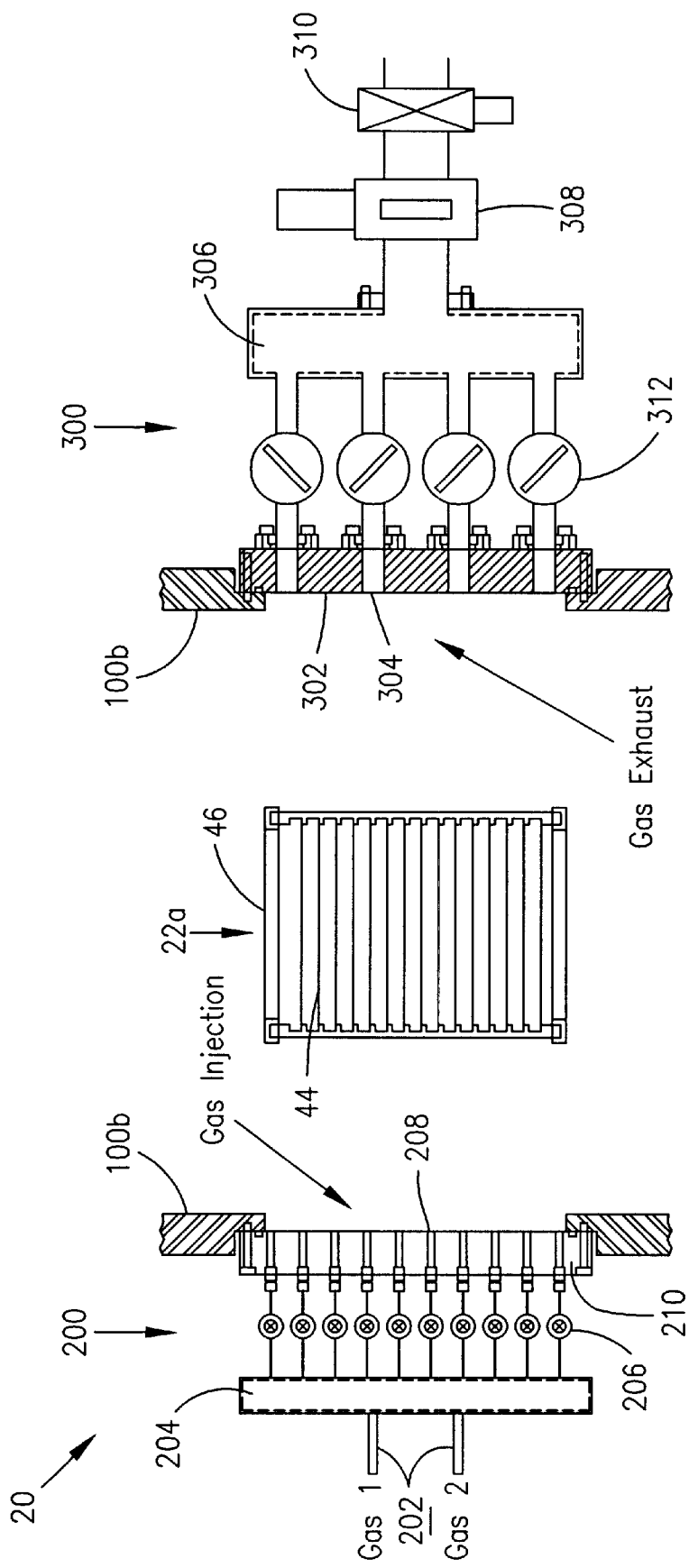
FIG. 30 is a cross-sectional view of gas injection systems and gas exhaust systems in accordance with the present invention.

The flow pattern of the process gases is vital to the formation of uniform layers upon wafers 44 to be processed in reactor 20, especially for those CVD processes dominated by mass transport limited reactions. Referring now to FIG. 30, process gases to be used in depositing layers on wafers 44 are provided via ducts 202 to a mixing chamber 204 which, along with a plurality of gas flow control devices 206 and a water-cooled injection plate 210, is included within gas injection manifold 200. Injection plate 204 is vacuum sealed to one of side walls 100b via an O-ring (not shown). After being mixing together in mixing chamber 204, the process gases are provided to ports 208 formed in injection plate 210 via associated flow rate control devices 206 which collectively allow for precise control over the amount of process gas flow provided into reaction chamber 22a.

Exhaust manifold 300 includes an exhaust plate 302 having plurality of exhaust ports 304, an exhaust plenum 306, a control throttle valve 308, and gate valve 310 and is vacuum sealed to the other of walls 100b via an O-ring (not shown). Process gases are removed from reaction chamber 22a through the plurality of ports 304 and are provided to exhaust plenum 306 via a plurality of associated exhaust flow control devices 312 which, in some embodiments, are similar to flow rate control devices 206. Process gases then flow through control throttle valve 308 and gate valve 310 to an external vacuum pump system (not shown). Exhaust plate 302 may be either cooled or heated via recirculating liquid or other means, depending upon the particular process employed. Note that for certain CVD processes it is desirable to heat the exhaust manifold 300 (and thus exhaust ports 304) in order to minimize condensation thereon. Flow rate control devices 206 and exhaust flow control devices 312 may be independently adjusted to allow for optimum process gas flow pattern within the reaction chamber 22a.

Figure 31A:
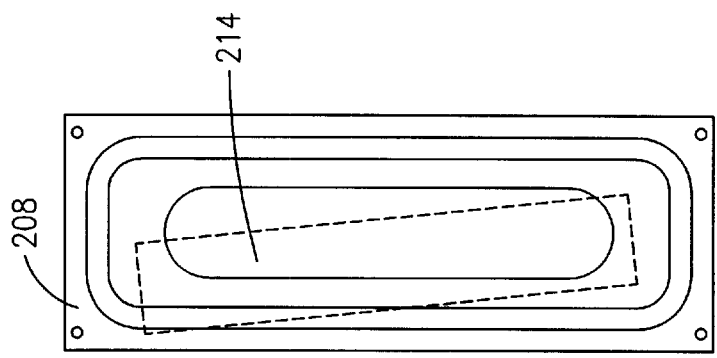
FIG. 31a is a cross-sectional view of one embodiment of the gas injection system of FIG. 30.
Figure 31B:
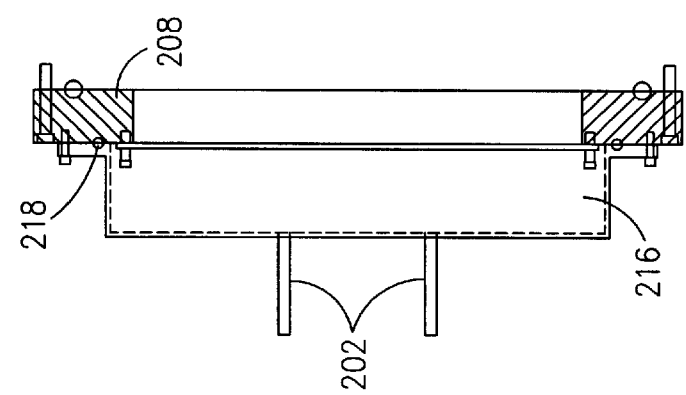
Figure 32A:
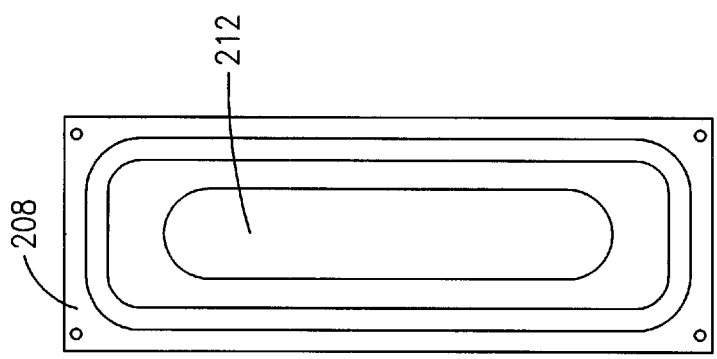
FIG. 32a is a cross-sectional view of another embodiment of the gas injection system of FIG. 30.
Figure 32B:
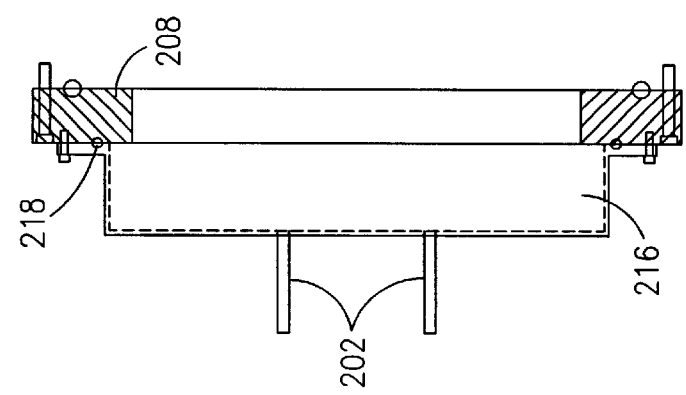

In some embodiments, injection plate 208 includes a single slot 212 through which the process gases enter the reaction chamber 22a, as shown in FIGS. 31a and 31b. In still other embodiments, a shutter plate 214 may be affixed to injection plate 208 at any desired angles to further control the amount of gas provided to reaction chamber 22a, as shown in FIGS. 32a and 32b. The embodiment shown in FIGS. 31a–31b and the embodiment shown in FIGS. 32a–32b include a plenum 216 attached and sealed to injection plate 208 via an O-ring 218. Note that a plate similar to shutter plate 212 may be affixed to exhaust plate 302 to further control the flow of exhaust gas.

Figure 33C:
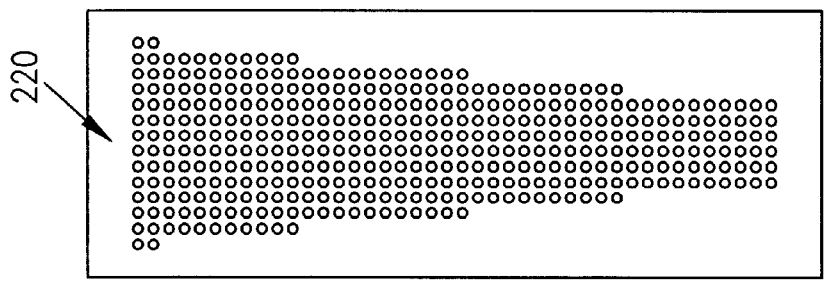
FIGS. 33b and 33c are front views of the gas injection system of FIG. 33a illustrating various positions of injection ports.
Figure 33B:
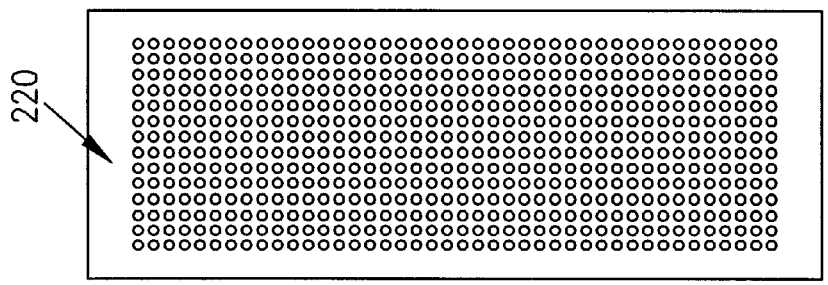
Figure 33A:
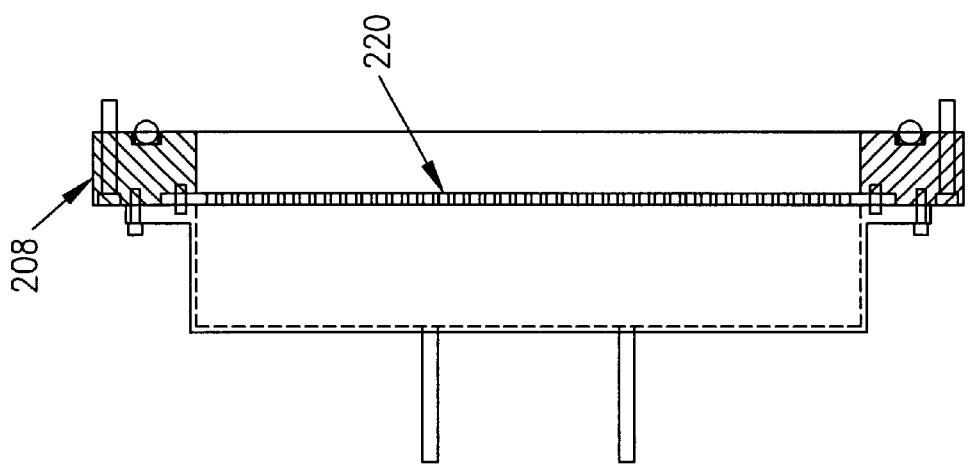
FIG. 33a is a cross-sectional view of yet another embodiment of the gas injection system of FIG. 30.

In yet other embodiments, shutter plate 214 may be replaced with a plate 220 having a plurality of small vias through which process gases provided to plenum 216 may flow into reaction chamber 22a, as shown in FIG. 33a. The plurality of vias formed in plate 220 may be arranged in any suitable manner, two examples of which are provided in respective FIGS. 33b and 33c. Plate 220 may also be liquid cooled. Note that a plate similar to plate 220 may be provided within exhaust manifold 300 to facilitate removal of process gases from reaction chamber 22a.

Figure 34:
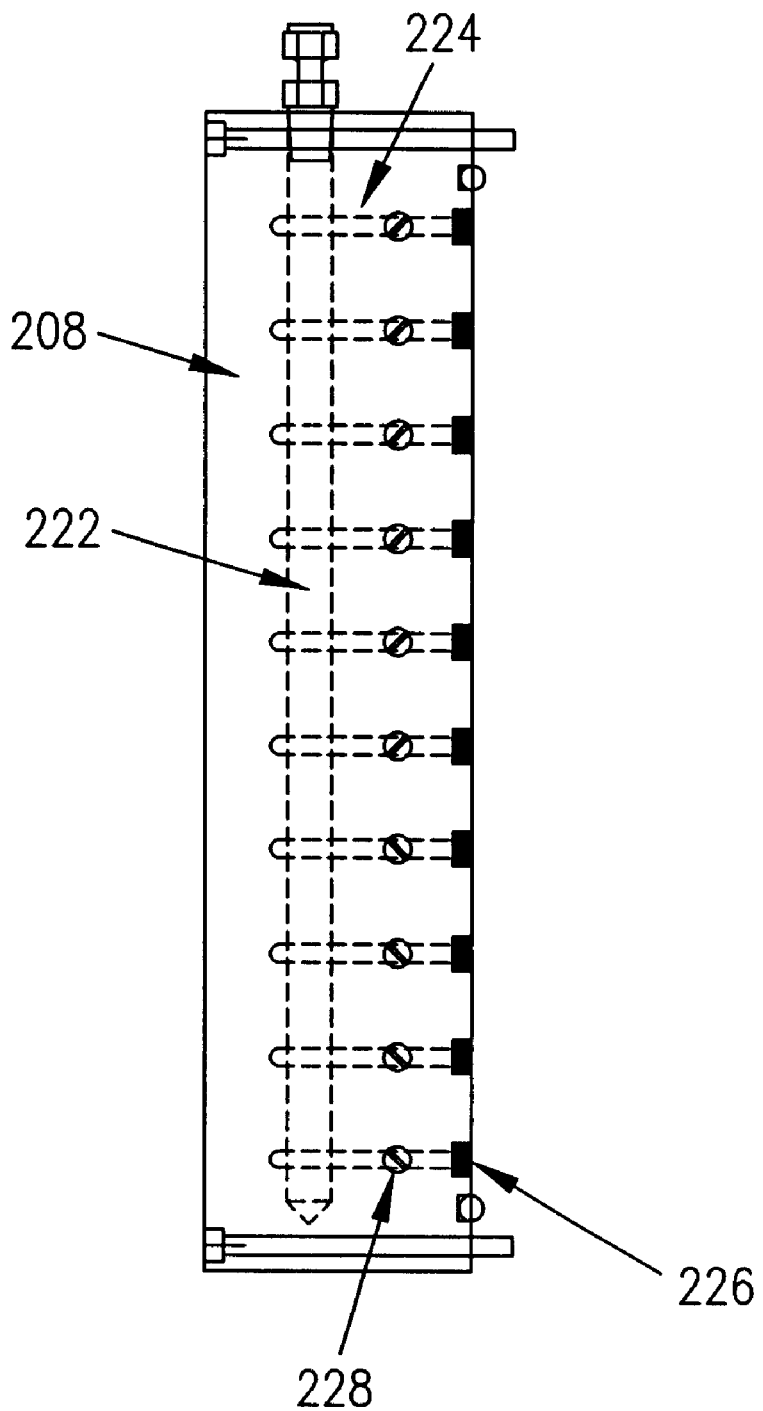
FIG. 34 is a cross-sectional view of still another embodiment of the gas injection system of FIG. 30.

In other embodiments, injection plate 208 may include one or more vertical gas supply shafts 222 into which are coupled a plurality of horizontal gas ducts 224, as shown in FIG. 34. Sintered metal disks 226 may be press fitted into counterbores at an end of ducts 224 to produce a more laminar gas flow and to reduce the entry of undesirable particles into reaction chamber 22a. Each of ducts 224 has provided therein a gas flow adjustment screw 228 which, by varying the cross-sectional area of ducts 224 through which process gas flows, controls the flow of reactant gas to reaction chamber 22a. Screws 228 are sealed to associated ducts 224 via O-rings (not shown). Of course, a similar duct structure may be employed to control the removal of process gases from reaction chamber 22a via exhaust manifold 300.

Figure 35:
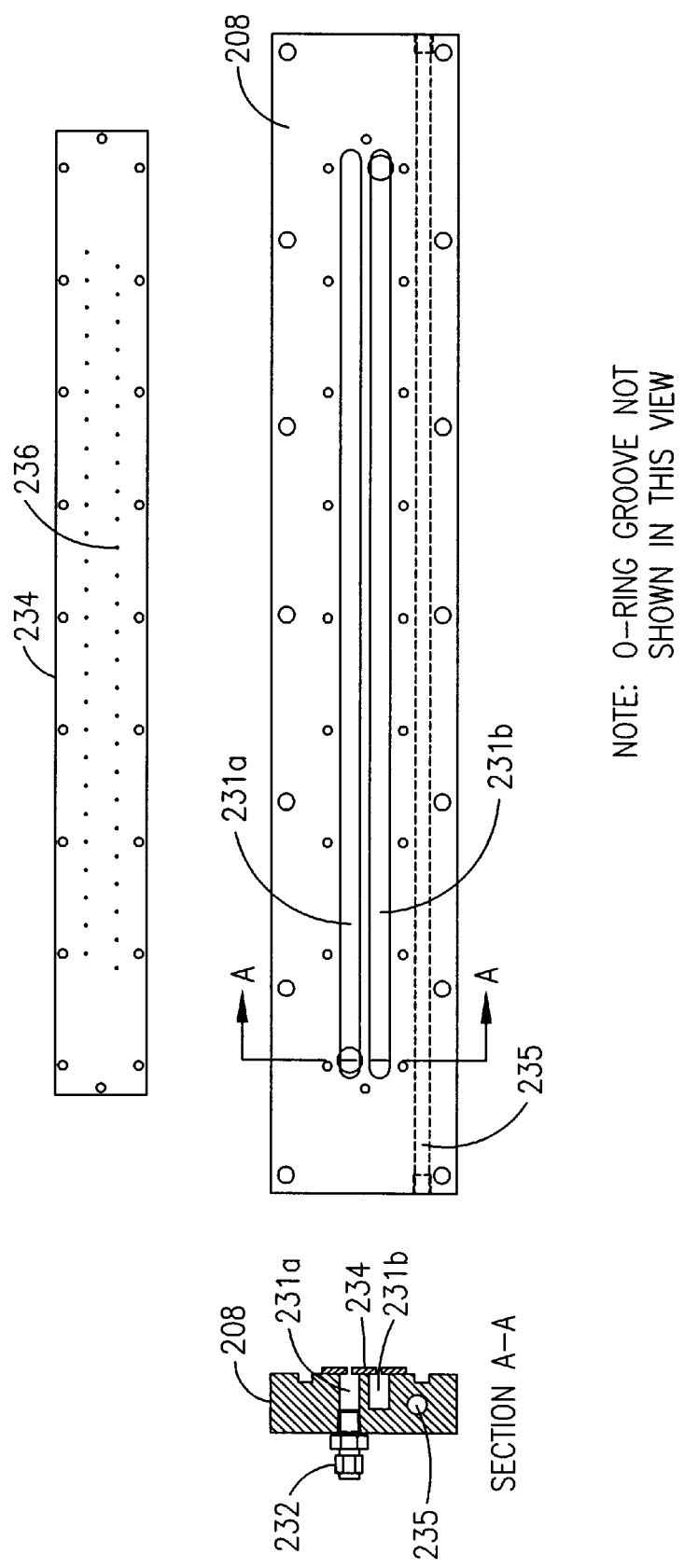
FIG. 35 is a side and cross-sectional view of still another embodiment of the gas injection system of FIG. 30.
Figure 36:
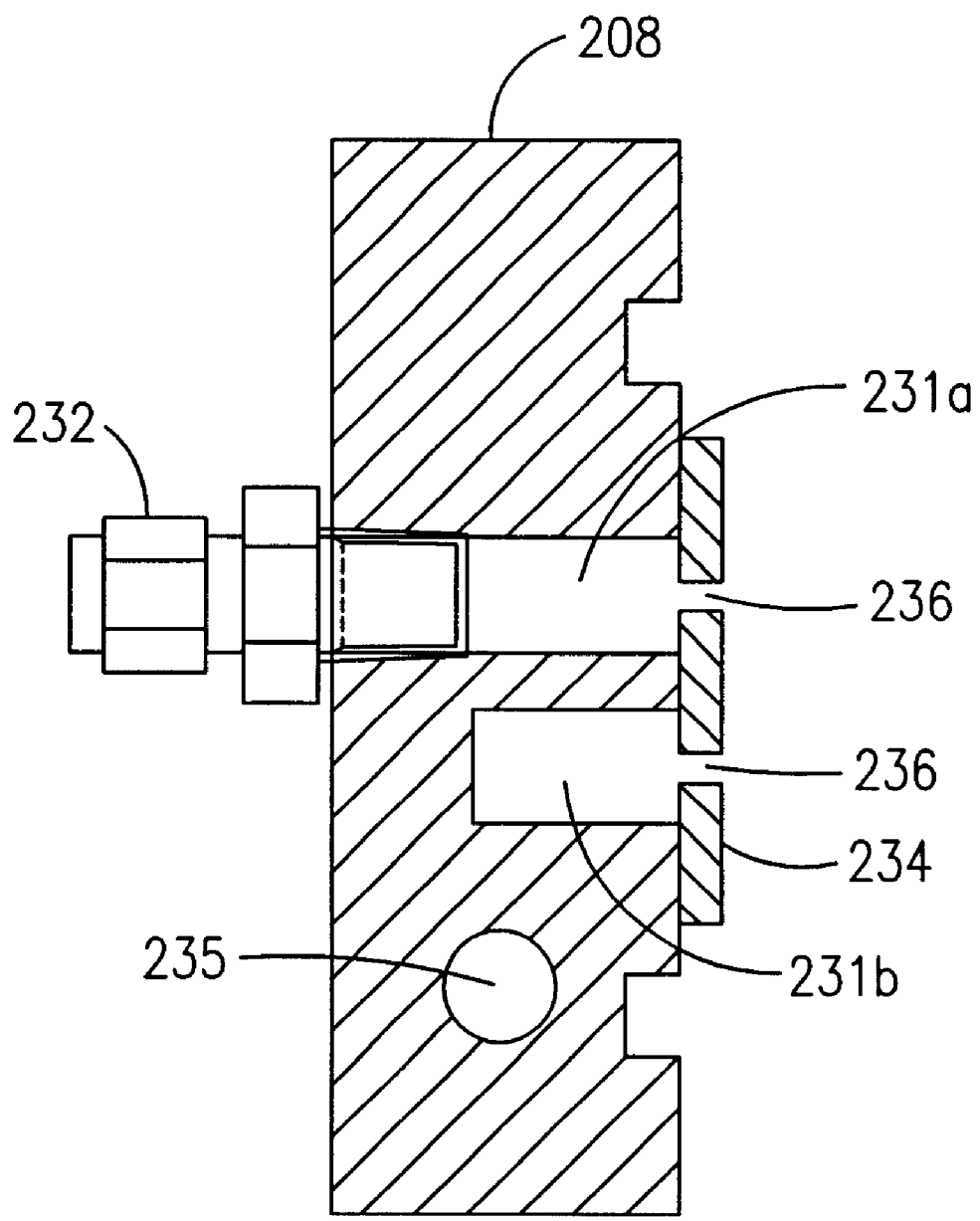
FIG. 36 is an exploded cross-sectional view of the gas injection system of FIG. 35.

In another embodiment (FIGS. 35 and 35a), the process gases separately enter the reaction chamber 22a and thus are mixed therein. The injection plate 208 has formed therein on the side facing the interior of chamber 22a a plurality (two shown) of slots 231a and 231b. A thinner plate 234 having a plurality of holes 236 which line up over the slots 231a and 231b is bolted to injection plate 208. The size, number and spacing of the holes in plate 234 may be varied throughout its length in order to produce the desired gas flow pattern to achieve uniform and consistent depositions onto all of the wafers 44 in wafer boat 46. The gases enter the channels 231a and 231b via holes drilled from the exterior side into which are gas fittings 232. Hole 235 is provided and tapped on both ends to accept fittings to allow liquid to flow through injection plate 208 for cooling. During processing of one or more wafers 44, inert gas is injected into lower chamber portion 22b via a gas inlet 68 to retard process gases escaping process chamber 22a and entering lower chamber portion 22b (FIG. 6). Electric motor 636 is activated and rotates shaft 48 and wafers 44 at a desired rate such as, for instance, between approximately 3 and 30 rpms. Power provided to the independent zones of heaters 400, 500, and 550 is adjusted to bring the temperature of reaction chamber 22a to a desired processing temperature, as described above.

Once the temperature of wafers 44 has stabilized in a uniform manner at the desired process temperature, reactant gases are injected into reaction chamber process portion 22a of chamber 20 via gas injection manifold 200 and are exhausted therefrom via exhaust manifold 300, as discussed above.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An apparatus for processing a plurality of semiconductor wafers, comprising:
   (a) a vacuum chamber having a top, a bottom, and one or more sidewalls including a metal portion, said chamber having an interior for placement of a wafer boat for processing a plurality of wafers, said chamber further including
      (i) a chamber side wall including a window for transmission of radiant heat energy from the exterior of said chamber through said window to said interior of said chamber; and
      (ii) a plurality of diffuser shield plates of low thermal mass material with gaps interposed between said plates, at least one of said plates positioned between said window and said interior for diffusing said heat energy for heating said wafers;
   (b) at least one radiant heat source located on the exterior of said vacuum chamber for transmitting heat energy through said window to said interior for heating said diffuser shield plate;
   (c) cooling apparatus for cooling of said metal portion of at least one of the top, botton, or side walls;
   (d) a positioning apparatus for positioning said boat in said interior of said chamber;
   (e) a gas injector apparatus for injecting a reactant gas substantially parallel across the deposition surface of each wafer, said gas injection apparatus located in a gap between said diffuser shield plates whereby the heat load on the gas injection apparatus is reduced; and
   (f) a gas exhaust for pulling said reactant gas substantially parallel across the deposition surface of each wafer, said exhaust apparatus positioned opposite said boat from said injector apparatus for exhausting said gas from said chamber.

2. The apparatus of claim 1, further comprising inert gas flow apparatus for introducing an inert gas flow between the window and the shield plate, whereby the gas flow retards unwanted deposition onto the window during CVD processing.

3. The apparatus of claim 1, wherein a portion of electrically conductive material within the chamber is connected to an RF energy source for the creation of a plasma within the chamber.

4. The apparatus of claim 3, further comprising at least one temperature sensor for sensing the temperature in the chamber, and controller for adjusting the radiant heat energy transmitted to different areas of the chamber, whereby the temperature in different areas of the chamber may be controlled and varied.

5. The apparatus of claim 1, further comprising rotation apparatus for rotating the boat during processing in the chamber.

6. The apparatus of claim 5, further comprising inert gas flow apparatus for introducing an inert gas flow between the window and the shield plate, whereby the gas flow retards unwanted deposition onto the window during CVD processing.

7. The apparatus of claim 5, wherein a portion of electrically conductive material within the chamber is connected to an RF energy source for the creation of a plasma within the chamber.

8. The apparatus of claim 5, further comprising at least one temperature sensor for sensing the temperature in the chamber, and controllers for adjusting the radiant heat energy transmitted to different: areas of the chamber, whereby the temperature in different areas of the chamber may be controlled and varied.

9. The apparatus of claim 1, wherein the means for introducing gas into the chamber is a gas injection manifold attached to the chamber, and the gas exhaust apparatus is a gas exhaust manifold attached to the chamber.

10. The apparatus of claim 9, wherein the gas injection manifold permits variation of the gas flow along an axis of the manifold.

11. The apparatus of claim 1, wherein the chamber is elongated to form a first interior chamber portion and a second interior chamber portion, wherein the first portion is used for loading and unloading of the substrates into the boat, and the second portion is used as a reaction chamber in which the substrates are processed.

12. The apparatus of claim 11, further comprising inert gas flow apparatus for introducing an inert gas flow between the indow and the shield plate, whereby the gas flow retards unwanted deposition onto the window during CVD processing.

13. The apparatus of claim 11, wherein a portion of electrically conductive material within the chamber is connected to an RF energy source for the creation of a plasma within the chamber.

14. The apparatus of claim 11, further comprising at least on temperature sensor for sensing the temperature in the chamber, and a controller for adjusting the radiant heat energy transmitted to different areas of the chamber, whereby the temperature in different areas of the chamber may be controlled and varied.

15. The apparatus of claim 11, wherein the gas introduction apparatus is a gas injection manifold attached to the chamber, and the means for exhausting gas from the chamber is a gas exhaust manifold attached to the chamber.

16. The apparatus of claim 15, wherein the gas injection manifold permits variation of gas flow along an axis of the manifold.

17. The apparatus of claim 11, wherein a seal plate may be movably positioned between the first portion and the second portion to isolate the first portion from the second portion.

18. The apparatus of claim 17, further comprising inert gas flow apparatus for introducing an inert gas flow between the window and the shield plate, whereby the gas flow retards unwanted deposition onto the window during CVD processing.

19. The apparatus of claim 17, wherein a portion of electrically conductive material within the chamber is connected to an RF energy source for the creation of a plasma within the chamber.

20. The apparatus of claim 17, further comprising at least one temperature sensing means for sensing the temperature in the chamber, and a controller for adjusting the radiant heat energy transmitted to different areas of the chamber, whereby the temperature in different areas of the chamber may be controlled and varied.

* * * * *